US011380700B2

(12) United States Patent
Kim et al.

(10) Patent No.: US 11,380,700 B2
(45) Date of Patent: Jul. 5, 2022

(54) VERTICAL MEMORY DEVICES

(71) Applicant: Samsung Electronics Co., Ltd., Suwon-si (KR)

(72) Inventors: Junhyoung Kim, Seoul (KR); Taemok Gwon, Seoul (KR); Youngbum Woo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 77 days.

(21) Appl. No.: 16/842,907

(22) Filed: Apr. 8, 2020

(65) Prior Publication Data

US 2021/0036001 A1 Feb. 4, 2021

(30) Foreign Application Priority Data

Aug. 1, 2019 (KR) ........................ 10-2019-0093735

(51) Int. Cl.
| | |
|---|---|
| *H01L 27/11573* | (2017.01) |
| *H01L 27/11556* | (2017.01) |
| *H01L 27/11582* | (2017.01) |
| *H01L 23/522* | (2006.01) |
| *H01L 27/07* | (2006.01) |

(52) U.S. Cl.
CPC .... *H01L 27/11556* (2013.01); *H01L 23/5223* (2013.01); *H01L 23/5226* (2013.01); *H01L 27/0733* (2013.01); *H01L 27/11582* (2013.01)

(58) Field of Classification Search
CPC ........... H01L 27/11556; H01L 27/0629; H01L 27/11573; H01L 27/11582; H01L 23/5223
See application file for complete search history.

(56) References Cited

U.S. PATENT DOCUMENTS

| | | | |
|---|---|---|---|
| 8,203,149 B2 | 6/2012 | Azuma | |
| 8,994,145 B2 | 3/2015 | Sato | |
| (Continued) | | | |

FOREIGN PATENT DOCUMENTS

| | | | |
|---|---|---|---|
| JP | 5558336 B2 | 7/2014 | |
| KR | 20160020210 A | 2/2016 | |
| KR | 20160135935 A | 11/2016 | |

OTHER PUBLICATIONS

Translation of an Office Action, dated Nov. 29, 2021, issued from the German Patent and Trademark Office for corresponding German Patent Application No. 10 2020 110 366.2.

*Primary Examiner* — Sarah K Salerno
(74) *Attorney, Agent, or Firm* — Muir Patent Law, PLLC

(57) ABSTRACT

A vertical memory device includes lower circuit patterns, a second substrate, a capacitor, gate electrodes, and a channel. The lower circuit patterns are formed on a first substrate including first, second and third regions. Contact plugs are formed in the second region. Through vias are formed in the third region. The second substrate is formed on the lower circuit patterns. The capacitor is formed on the lower circuit patterns, and includes a first conductor, a dielectric layer structure, and a second conductor. The first conductor is spaced apart from the second substrate at the same height as the second substrate. The dielectric layer structure is formed on the first conductor. The second conductor is formed on the dielectric layer structure. The gate electrodes are spaced apart from each other on the second substrate in a vertical direction. The channel extends through the gate electrodes in the vertical direction.

19 Claims, 21 Drawing Sheets

(56) References Cited

U.S. PATENT DOCUMENTS

| | | |
|---|---|---|
| 9,425,210 B2 | 8/2016 | Lee et al. |
| 9,472,569 B2 | 10/2016 | Lee et al. |
| 9,589,981 B2 | 3/2017 | Nishikawa et al. |
| 9,627,405 B1 | 4/2017 | Lee |
| 9,824,966 B1 | 11/2017 | Kanakamedala et al. |
| 9,997,534 B2 | 6/2018 | Son et al. |
| 2015/0035065 A1 | 2/2015 | Park et al. |
| 2020/0058671 A1 | 2/2020 | Kim et al. |
| 2020/0312861 A1* | 10/2020 | Kim ............... H01L 29/0847 |

* cited by examiner

VERTICAL MEMORY DEVICES

CROSS-REFERENCE TO RELATED APPLICATION

This application claims priority under 35 U.S.C. § 119 to Korean Patent Application No. 10-2019-0093735, filed on Aug. 1, 2019, in the Korean Intellectual Property Office (KIPO), the contents of which are herein incorporated by reference in their entirety.

BACKGROUND

1. Field

Example embodiments relate to a vertical memory device.

2. Description of the Related Art

In a VNAND flash memory device, capacitors may be formed by contact plugs on a peripheral circuit region, however; in a cell-over-peripheral (COP) structure not having contact plugs on the peripheral circuit region, capacitors may be formed only by though hole vias (THVs). As the number of stacked gate electrodes increases in the VNAND flash memory device, the height of a mold including the gate electrodes may increase, and if large number of THVs are formed in order to obtain sufficient capacitors, cracks may be generated in the mold.

SUMMARY

Example embodiments provide a vertical memory device having improved electrical characteristics.

According to example embodiments, there is provided a vertical memory device. The vertical memory device may include lower circuit patterns, a second substrate, a capacitor, gate electrodes, and a channel. The lower circuit patterns may be formed on a first substrate including a first region, a second region at least partially surrounding the first region, and a third region at least partially surrounding the second region. Memory cells may be formed in the first region. Contact plugs transferring electrical signals to the memory cells may be formed in the second region. Through vias transferring electrical signals to the lower circuit patterns may be formed in the third region. The second substrate may be formed on the lower circuit patterns in the first and second regions of the first substrate. The capacitor may be formed on the lower circuit patterns in the third region of the first substrate, and may include a first conductor, a dielectric layer structure, and a second conductor. The first conductor may be spaced apart from the second substrate, and may be at a height substantially the same as that of the second substrate. The dielectric layer structure may be formed on the first conductor. The second conductor may be formed on the dielectric layer structure. The gate electrodes may be spaced apart from each other on the second substrate in the first and second regions of the first substrate in a vertical direction substantially perpendicular to an upper surface of the first substrate. The channel may extend lengthwise through the gate electrodes in the vertical direction in the first region of the first substrate.

According to example embodiments, there is provided a vertical memory device. The vertical memory device may include gate electrodes, channels, a channel connection pattern, and a capacitor. The gate electrodes may be spaced apart from each other on a substrate in a vertical direction substantially perpendicular to an upper surface of the substrate. The channels may extend through the gate electrodes in the vertical direction on the substrate. The channel connection pattern may be formed under the gate electrodes on the substrate, and may contact lower portions of the channels so as to connect the channels with each other. The capacitor may include a first conductor, a dielectric layer structure, and a second conductor. The first conductor may be spaced apart from the substrate in a horizontal direction substantially parallel to the upper surface of the substrate. The dielectric layer structure may include first, second, and third layers sequentially stacked on the first conductor, which may include an oxide, a nitride, and an oxide, respectively. The second conductor may be formed on the dielectric layer structure. The dielectric layer structure and the channel connection pattern may be formed at a height substantially the same as each other.

According to example embodiments, there is provided a vertical memory device. The vertical memory device may include transistors, lower circuit patterns, an insulating interlayer, a second substrate, a capacitor, gate electrodes, channels, a charge storage structure, upper wirings, a first contact plug, a second contact plug, and a through via. The transistors may be formed on a first substrate. The lower circuit patterns may be formed on the first substrate to be electrically connected to the transistors. The insulating interlayer may be formed on the first substrate to cover the transistors and the lower circuit patterns. The second substrate may be formed on the insulating interlayer. The capacitor may be formed on the insulating interlayer to include first and second conductors and a dielectric layer structure. The first conductor may be spaced apart from the second substrate to be at a height substantially the same as that of the second substrate. The dielectric layer structure may be formed on the first conductor. The second conductor may be formed on the dielectric layer structure. The gate electrodes may be spaced apart from each other on the second substrate in a vertical direction substantially perpendicular to an upper surface of the first substrate. The channel may extend through the gate electrodes in the vertical direction on the second substrate. The charge storage structure may be formed on an outer sidewall of each of the channels. The upper wirings may be formed on the gate electrodes to be electrically connected to the gate electrodes, respectively. The first contact plug may be electrically connected to the first conductor. The second contact plug may be electrically connected to the second conductor. The through via may be spaced apart from the capacitor in a horizontal direction substantially parallel to the upper surface of the first substrate to be electrically connected to the lower circuit patterns.

The vertical memory device in accordance with example embodiments may include the capacitor having the first conductor, the dielectric layer structure and the second conductor sequentially stacked in the peripheral region surrounding the cell region, and the capacitor may have a maximum area within the range in which the capacitor may not contact the through vias. Thus, the vertical memory device may include the capacitor having the large capacitance.

DESCRIPTION OF EMBODIMENTS

Figure 1:
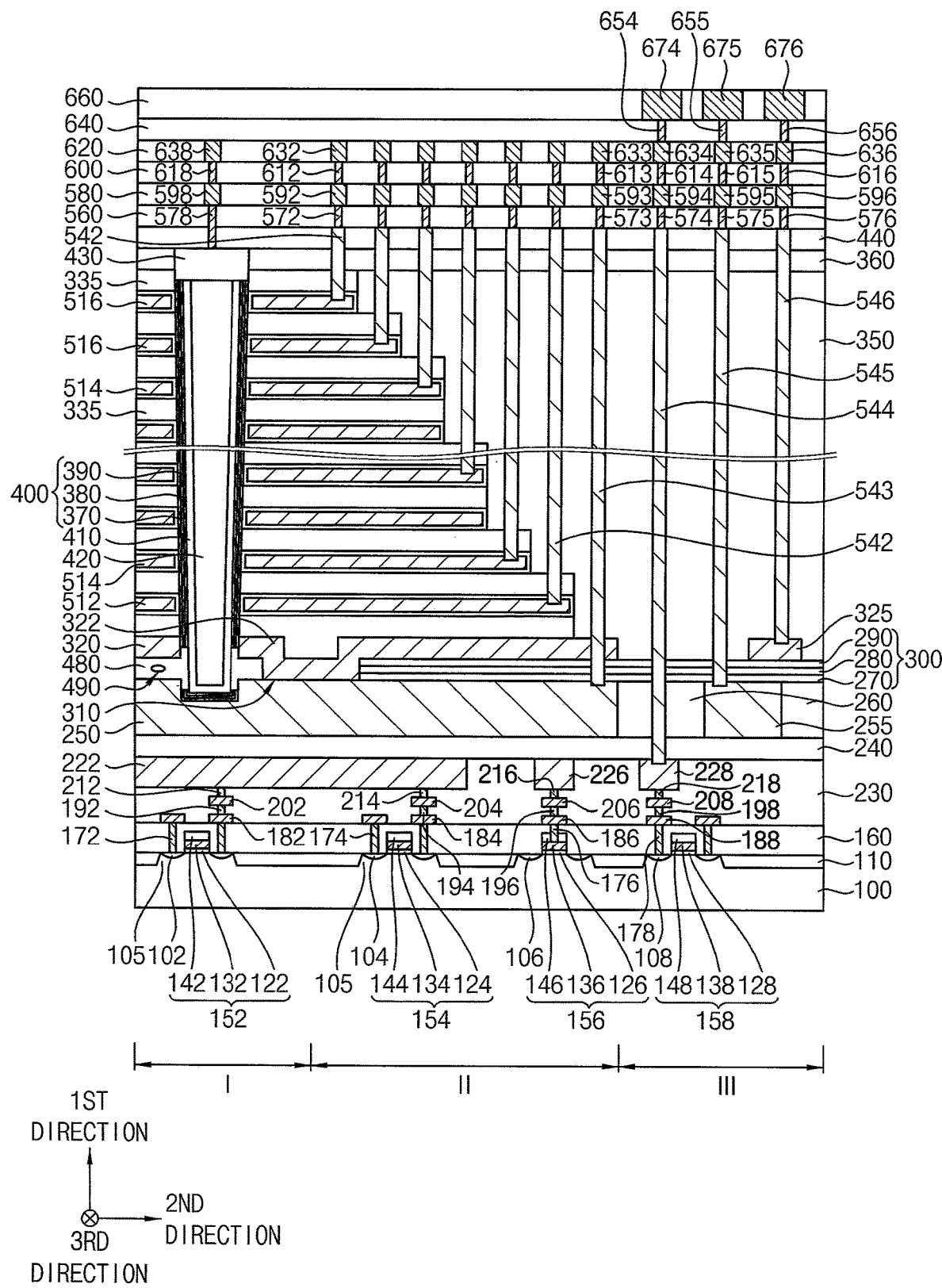
FIGS. 1, 2, 3A and 3B are cross-sectional views and plan views illustrating a vertical memory device in accordance with example embodiments.

Vertical memory devices and methods of manufacturing the same in accordance with example embodiments will be described more fully hereinafter with reference to the accompanying drawings. In the drawings, like numbers refer to like elements throughout.

Hereinafter, throughout the specifications (not in the claims), a vertical direction substantially perpendicular to an upper surface of a first substrate is defined as a first direction, and two directions intersecting with each other among horizontal directions substantially parallel to the upper surface of the first substrate are defined as second and third directions, respectively. In example embodiments, the second and third directions may be orthogonal to each other.

It will be understood that, although the terms first, second, third etc. may be used herein to describe various elements, components, regions, layers, or sections, these elements, components, regions, layers, and/or sections should not be limited by these terms. Unless the context indicates otherwise, these terms are only used to distinguish one element, component, region, layer, or section from another element, component, region, layer, or section, for example as a naming convention. Thus, a first element, component, region, layer, or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" "second" in a claim in order to distinguish different claimed elements front each other.

Figure 2:
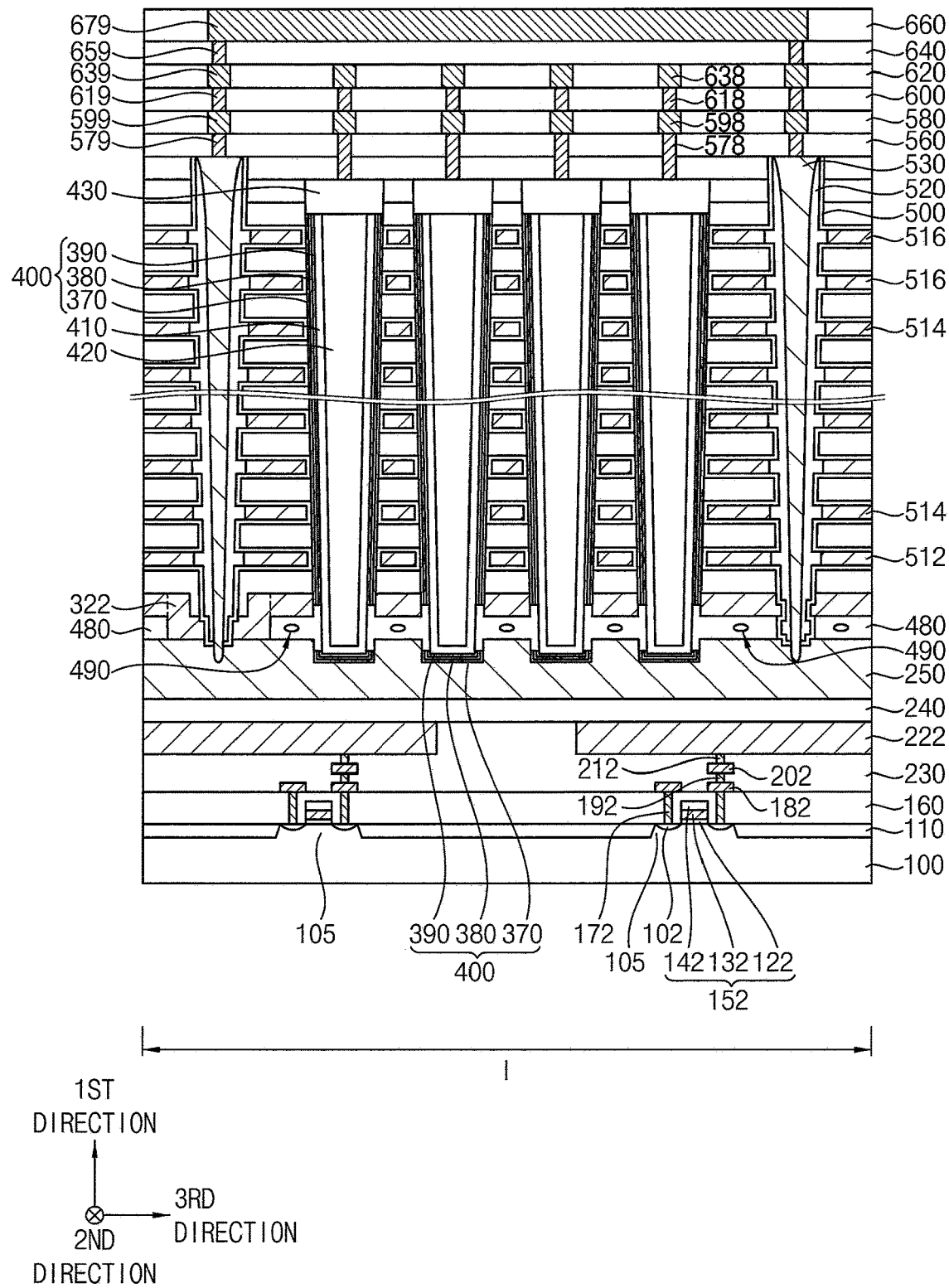
Figure 3A:
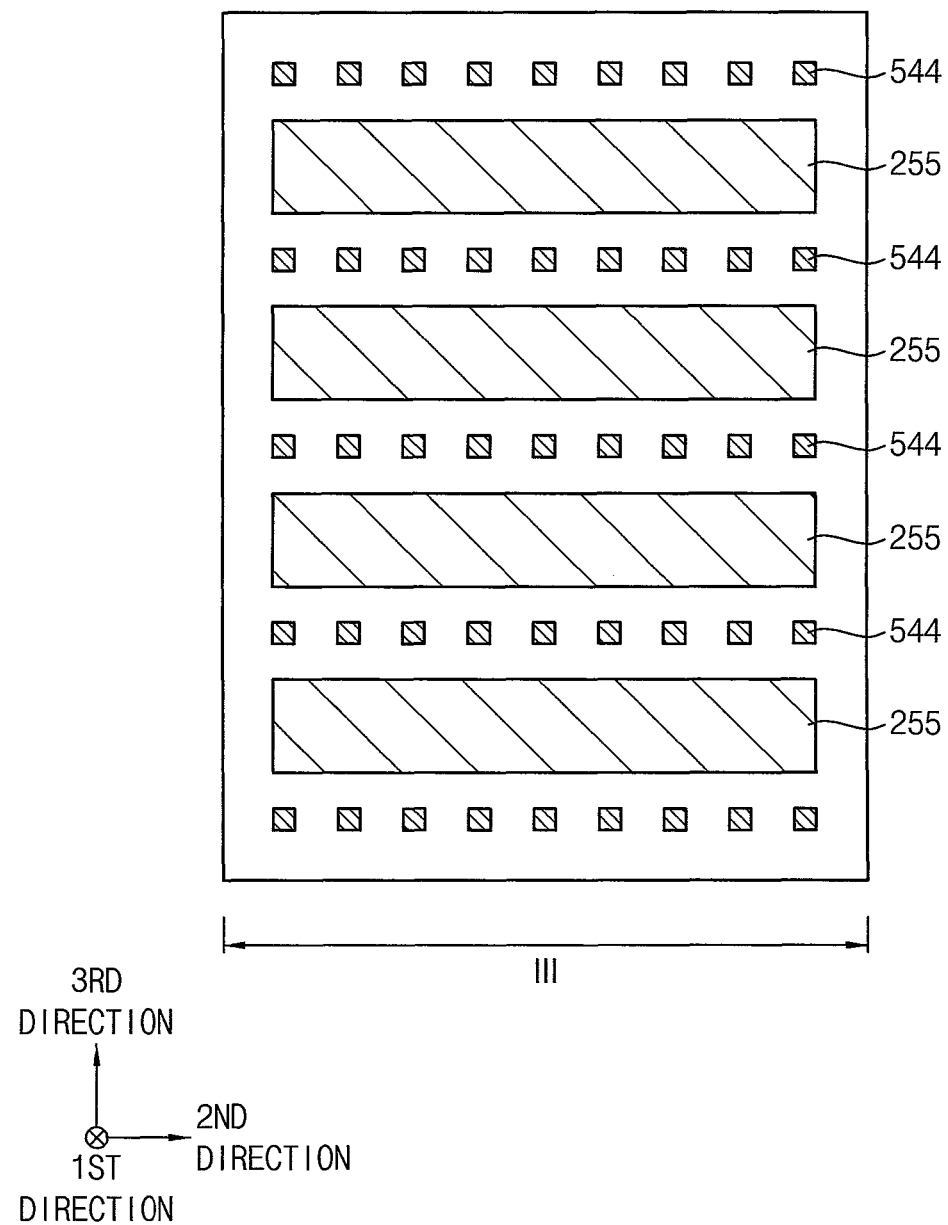
Figure 3B:
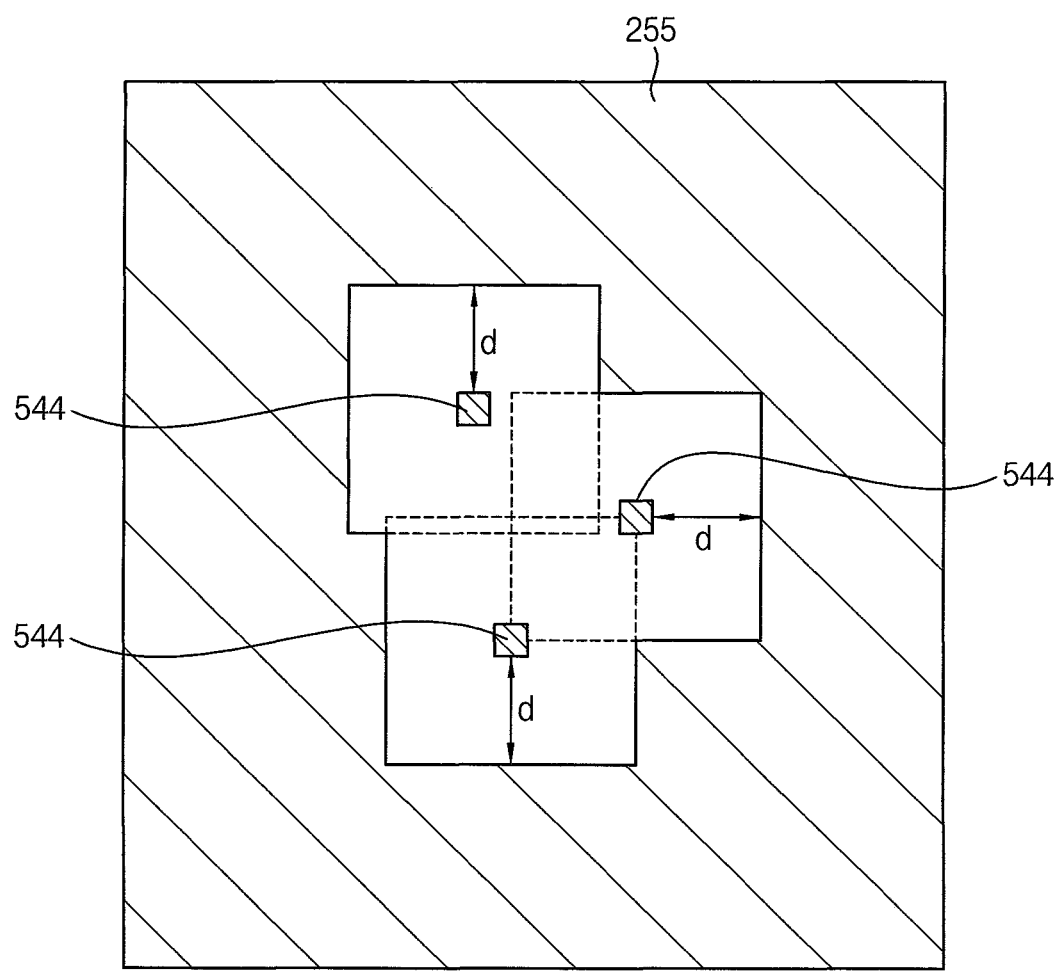

FIGS. 1, 2, 3A, and 3B are cross-sectional views and plan views, respectively, illustrating a vertical memory device in accordance with example embodiments. Particularly, FIG. 1 is a cross-sectional view of the vertical memory device taken along the second direction, FIG. 2 is a cross-sectional view of the vertical memory device taken along the third direction, and FIGS. 3A and 3B are plan views of layouts of first conductors and through vias.

Referring to FIGS. 1, 2, 3A, and 3B, the vertical memory device may include lower circuit patterns on a first substrate 100, a second substrate 250 and a capacitor on the lower circuit patterns, a channel connection pattern 480, a support layer 320, a support pattern 322, sacrificial layer structure 300 and memory cells on the second substrate 250, contact plugs 542, 543, 544, 545 and 546 on the second substrate 250, the capacitor and the lower circuit patterns, and upper wiring structures. The vertical memos device may further include a division structure, first to third insulating interlayers 160, 230 and 240, a fourth insulating interlayer pattern 260, and fifth to thirteenth insulating interlayers 350, 360, 440, 560, 580, 600, 620, 640 and 660.

Each of the first and second substrates 100 and 250 may include semiconductor materials silicon, germanium, silicon-germanium, etc., or III-V compounds GaP, GaAs, GaSb, etc. In example embodiments, each of the first and second substrates 100 and 250 may be a silicon-on-insulator (SOB) substrate or a germanium-on-insulator (GOT) substrate. In example embodiments, the second substrate 250 may include polysilicon doped with, e.g., n-type impurities.

The first substrate 100 may include a field region on which an isolation pattern 110 is formed, and an active region 105 on which no isolation pattern is formed. The isolation pattern 110 may include an oxide, e.g., silicon oxide.

In example embodiments, the first substrate 100 may include first, second, and third regions I, II, and III. Hereinafter in the specifications and the claims, each of the first to third regions I, II, and III may refer to not only a portion of the first substrate 100 but also a space over the first substrate 100 in the first direction.

The first region I may be a cell array region in which memory cells may be formed, the second region II may be an extension region or pad region at least partially surrounding the first region I in which contact plugs transferring electrical signals to the memory cells and upper wiring structures connected thereto may be formed, and the third region III may be a peripheral region at least partially surrounding the second region II in which through vias transferring electrical signals to the lower circuit patterns, contact plugs transferring electrical signals to the capacitor, and upper wiring structures connected thereto may be formed.

The first and second regions I and II may form a cell region, and thus the peripheral region may at least partially surround the cell region. FIGS. 1, 2, 3A, and 3B show a portion of each of the first to third regions I, II, and III.

In example embodiments, the vertical memory device may have a cell-over-peripheral (COP) structure. That is, the lower circuit patterns may be formed on the first substrate 100 including the first to third regions I, II, and III, and the memory cells, the contact plugs, the through vias, and the upper wiring structures may be formed over the lower circuit patterns. The memory cells may be formed on the second substrate 250 in the first region I of the first substrate 100, some of the contact plugs and the upper wiring structures may be formed on the second substrate 250 in the second region II of the first substrate 100, and some of the contact plugs and the upper wiring structures and the through vias may be formed on the capacitors and the lower circuit patterns on the third region III of the first substrate 100.

The lower circuit patterns may include transistors, lower contact plugs, lower wirings, lower vias, etc. in an example embodiment, a first transistor including a first lower gate structure 152 on the first substrate 100 and a first impurity region 102 at an upper portion of the active region 105 adjacent the first lower gate structure 152, a second transistor including a second lower gate structure 154 on the first substrate 100 and a second impurity region 104 at an upper portion of the active region 105 adjacent the second lower gate structure 154, a third transistor including a third lower gate structure 156 on the first substrate 100 and a third impurity region 106 at an upper portion of the active region 105 adjacent the third lower gate structure 156, and a fourth transistor including a fourth lower gate structure 158 on the first substrate 100 and a fourth impurity region 108 at an upper portion of the active region 105 adjacent the fourth lower gate structure 158 be formed.

The first lower gate structure 152 may include a first lower gate insulation pattern 122, a first lower gate electrode 132, and a first lower gate mask 142 sequentially stacked on the first substrate 100 the second lower gate structure 154 may include a second lower gate insulation pattern 124, a second lower gate electrode 134, and a second lower gate mask 144 sequentially stacked on the first substrate 100; the third lower gate structure 156 may include a third lower gate insulation pattern 126, a third lower gate electrode 136, and a third lower gate mask 146 sequentially stacked on the first substrate 100; and the fourth lower gate structure 158 may include a fourth lower gate insulation pattern 128, a fourth lower gate electrode 138, and a fourth lower gate mask 148 sequentially stacked on the first substrate 100.

The first insulating interlayer 160 may be formed on the first substrate 100 to cover the first to fourth transistors, and first, second, and fourth lower contact plugs 172, 174, and 178 may be formed through the first insulating interlayer 160 to contact the first, second, and fourth impurity regions 102, 104, and 108, respectively. A third lower contact plug 176 may be formed through the first insulating interlayer 160 to contact a gate of the third transistor.

First to fourth lower wirings 182, 184, 186, and 188 may be formed on the first insulating interlayer 160 to contact the first to fourth lower contact plugs 172, 174, 176, and 178, respectively. A first lower via 192, a fifth lower wiring 202, a fifth lower via 212, and a ninth lower wiring 222 may be sequentially stacked on the first lower wiring 182; a second lower via 194, a sixth lower wiring 204, a sixth lower via 214 and the ninth lower wiring 222 may be sequentially stacked on the second lower wiring 184; a third lower via 196, a seventh lower wiring 206, a seventh lower via 216 and a tenth lower wiring 226 may be sequentially stacked on the third lower wiring 186; and a fourth lower via 198, an eighth lower wiring 208, an eighth lower via 218 and an eleventh lower wiring 228 may be sequentially stacked on the fourth lower wiring 188.

The first to fourth lower contact plugs 172, 174, 176, and 178, the first to eighth lower vias 192, 194, 196, 198, 212, 214, 216, and 218, and the first to eleventh lower wirings 182, 184, 186, 188, 202, 204, 206, 208, 222, 226, and 228 may include a conductive material, e.g., a metal, a metal nitride, a metal silicide, doped polysilicon, etc.

The second insulating interlayer 230 may be formed on the first insulating interlayer 160 to cover the first to eighth lower vias 192, 194, 196, 198, 212, 214, 216, and 218 and the first to eighth lower wirings 182, 184, 186, 188, 202, 204, 206, and 208, and surround sidewalls of the ninth to eleventh lower wirings 222, 226, and 228. The third insulating interlayer 240 may be formed on the second insulating interlayer 230 and the ninth to eleventh lower wirings 222, 226, and 228. The first to third insulating interlayers 160, 230, and 240 may form a lower insulating interlayer structure, and in some cases, may be a single layer because the first to third insulating interlayers 160, 230, and 230 may be merged with each other.

The second substrate 250 may be formed on the third insulating interlayer 240 in the first and second regions I and II of the first substrate 100, and a sidewall of the second substrate 250 may be covered by the fourth insulating interlayer pattern 260. The fourth insulating interlayer pattern 260 may include an oxide, e.g., silicon oxide, and thus may be merged with the third insulating interlayer 240.

The memory cells may be formed on the second substrate 250 in the first and second regions I and II of the first substrate 100. The memory cells may be arranged in the second and third directions to form a memory cell array. The memory cell array may include a plurality of memory cell blocks spaced apart from each other in the third direction by the division structure extending in the second direction.

The division structure may include a common source pattern (CSP) 530 extending in the second direction, and a second spacer 520 covering an each of opposite sidewalls of the CSP 530 in the third direction. The CSP 530 may include a metal, a metal nitride, a metal silicide, etc., and the second spacer 520 may include an oxide, e.g., silicon oxide.

Each of the memory cell blocks may include a channel block therein. The channel block may include a plurality of channel columns, each of which may include a plurality of channels 410 arranged in the second direction.

Each of the memory cell blocks may include a plurality of gate electrodes 512, 514, and 516 spaced apart from each other in the first direction, the insulation patterns 335 between neighboring ones of the gate electrodes 512, 514, and 516 in the first direction, pillar structures extending through the gate electrodes 512, 514, and 516 and the insulation patterns 335, and a capping pattern 430.

The gate electrodes 512, 514, and 516 may be formed on the second substrate 250 in the first and second regions I and II of the first substrate 100, and a plurality of gate electrodes 512, 514, and 516 may be formed at a plurality of levels, respectively, to be spaced apart from each other in the first direction. Each of the gate electrodes 512, 514, and 516 may extend lengthwise in the second direction on the first and second regions I and II of the first substrate 100. Extension lengths of the gate electrodes 512, 514, and 516 in the second direction may gradually decrease from a lowermost level toward an uppermost level, and thus the gate electrodes 512, 514, and 516 may have a staircase shape as a whole.

The gate electrodes 512, 514, and 516 may include first, second, and third gate electrodes 512, 514, and 516 sequentially stacked in the first direction. The first gate electrode 512 may serve as a ground selection line (GSL), the second gate electrode 514 may serve as a word line, and the third gate electrode 516 may serve as a string selection line (SSL).

Each of the first to third gate electrodes 512, 514, and 516 may be formed at one or a plurality of levels. In example embodiments, the first gate electrode 512 may be formed at the lowermost level, the third gate electrodes 516 may be formed at the uppermost level and a level directly below the uppermost level, i.e., a second level from above, and the second gate electrodes 514 may be formed between the first and third gate electrodes 512 and 516.

Each of the gate electrodes 512, 514, and 516 may include a conductive pattern and a barrier pattern covering upper and lower surfaces and a sidewall of the conductive pattern. The conductive pattern may include a low resistance metal, e.g., tungsten, titanium, tantalum, platinum, etc., and the barrier pattern may include a metal nitride, e.g., titanium nitride, tantalum nitride, etc.

Sidewalls of the gate electrodes 512, 514, and 516, which may be stacked in a staircase shape, may be covered by the fifth insulating interlayer 350, and the sixth to thirteenth insulating interlayers 360, 440, 560, 580, 600, 620, 640, and 660 may be sequentially stacked on an uppermost one of the insulation patterns 335 and the fifth insulating interlayer 350. Each of the fifth to thirteenth insulating interlayers 350, 360, 440, 560, 580, 600, 620, 640, and 660 may include an oxide, e.g., silicon oxide, and thus may be merged with each other and/or merged with the fourth insulating interlayer pattern 260.

Upper and lower surfaces and a sidewall facing the channel 410 of each of the gate electrodes 512, 514, and 516 may be covered by a second blocking layer 500. The second blocking layer 500 may include a metal oxide, e.g., aluminum oxide, hafnium oxide, etc., and may also cover a sidewall of the insulation pattern 335.

The insulation pattern 335 may include an oxide, e.g., silicon oxide.

Each of the pillar structures may include a charge storage structure 400, the channel 410 and a filling pattern 420 on the second substrate 250, and the capping pattern 430 may be formed on each of the pillar structures.

The channel 410 may extend lengthwise in the first direction on the second substrate 250 in the first region I of the first substrate 100 to have a cup-like shape. The charge storage structure 400 may include a first (or upper) portion extending in the first direction to cover most of an outer sidewall of the channel 410, and a second (or lower) portion covering a bottom surface and a lower sidewall of the channel 410 on the second substrate 250. The filling pattern 420 may have a pillar shape for filling an inner space defined by the cup-like shaped channel 410.

The charge storage structure 400 may include a tunnel insulation pattern 390, a charge storage pattern 380, and a first blocking pattern 370 sequentially stacked in the horizontal direction from the outer sidewall of the channel 410. For example, tunnel insulation pattern 390 may contact the outer sidewall of the channel 410, the charge storage pattern 380 may contact the outer sidewall of the tunnel insulation pattern 390, and the first blocking pattern 370 may contact the outer sidewall of the charge storage patters 380.

The channel 410 may include doped or undoped single crystalline silicon. The first blocking pattern 370 may include an oxide, e.g., silicon oxide, the charge storage pattern 380 may include a nitride, e.g., silicon nitride, and the tunnel insulation pattern 390 may include an oxide, e.g., silicon oxide. The filling pattern 420 may include an oxide, e.g., silicon oxide.

The capping pattern 430 may include, e.g., doped single crystalline silicon. The capping pattern 430 may extend through the sixth insulating interlayer 360 and an upper portion of an uppermost one of the insulation patterns 335. The capping pattern 430 may contact top surfaces of the filling pattern 420, the channel 410, the tunnel insulation pattern 390, the charge storage pattern 380, and the first blocking pattern 370.

The channel connection pattern 480 may be formed on the second substrate 250 in the first region I of the first substrate 100 to contact a lower outer sidewall of each of the channels 410. The channel connection pattern 480 may be between the first and second portions of the charge storage structure 400. For example, the channel connection pattern 480 may contact a portion of the outer sidewall of each of the channels 410 between the lower and upper portions of the charge storage structure 400, and thus the channels 410 in the same channel block may be connected with each other. The channel connection pattern 480 may include, e.g., polysilicon doped with n-type impurities, and an air gap 490 may be formed in the channel connection pattern 480.

The sacrificial layer structure 300 may be formed on the second substrate 250, the fourth insulating interlayer pattern 260, and a first conductor 255 in the second and third regions II and III of the first substrate 100. The sacrificial layer structure 300 may include first, second, and third sacrificial layers 270, 280, and 290 sequentially stacked in the first direction. Each of the first to third sacrificial layers 270, 280, and 290 may include an oxide, e.g., silicon oxide, a nitride, e.g., silicon nitride, and an oxide, e.g., silicon oxide, respectively.

In example embodiments, the channel connection pattern 480 may fill a first gap 470 (refer to FIGS. 10 and 11) that may be formed by removing a portion of the sacrificial layer structure 300 on the second substrate 250 in the first region I of the first substrate 100, and thus may be formed at the same height as that of the sacrificial layer structure 300. For example, top surfaces of the channel connection pattern 480 and the sacrificial layer structure 300 may be coplanar with one another, and bottom surfaces of the channel connection pattern 480 and the sacrificial layer structure 300 may be coplanar with one another.

The support layer 320 may be formed between a lowermost one of the gate electrodes 512, 514, and 516 and the channel connection pattern 480 in the first region I of the first substrate 100. However, a portion of the support layer 320 may extend through the channel connection pattern 480 or the sacrificial layer structure 300 to contact an upper surface of the second substrate 250. This portion of the support layer 320 may be referred to as the support pattern 322. A plurality of support patterns 322 may be formed in the first and second regions I and II of the first substrate 100, and may have various layouts. For example, a plurality of support patterns 322 may be formed in the second and third directions, and some of the support patterns 322 may extend lengthwise in the second or third directions.

The capacitor may include the first conductor 255, a dielectric layer structure, and a second conductor 325 sequentially stacked in the first direction.

The first conductor 255 may be formed on the third insulating interlayer 240 in the third region III of the first substrate 100, and a sidewall of the first conductor 255 may be covered by the fourth insulating interlayer pattern 260. In example embodiments, the first conductor 255 may be formed at the same height (e.g., vertical level) as that of the second substrate 250, and may include the same material as that of the second substrate 250, e.g., poly silicon doped with n-type impurities. For example, top surfaces of the first conductor 255 and the second substrate 250 may be coplanar with one another, and bottom surfaces of the first conductor 255 and the second substrate 250 may be coplanar with one another.

Terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Referring to FIG. 3A, in example embodiments, the first conductor 255 may extend lengthwise in the second direction, and a plurality of first conductors 255 may be formed to be spaced apart from each other in the third direction. However, the inventive concept may not be limited thereto. For example, one or a plurality of first conductors 255 may be formed to have various layouts according to the layout of the through vias, which may be formed adjacent to the first conductor 255 to be electrically connected to the lower circuit patterns, that is, the third contact plug 544. For example, the first conductor 255 may be formed in a space where the third contact plug 544 is not formed in the third region III of the first substrate 100.

However, referring to FIG. 3B, the first conductor 255 may be formed to be spaced apart from each of the third contact plugs 544 by a distance d, and thus each of the third contact plugs 544 may not contact the first conductor 255 even if misalignment occurs. In example embodiments, the first conductor 255 may cover a remaining area except for an area within the distance d from each of the third contact plugs 544 in the third region III of the first substrate 100. The more area the first conductor 255 has, the more capacitance the capacitor including the first conductor 255 may have.

The dielectric layer structure may refer to a portion of the sacrificial layer structure 300 between the first and second conductors 255 and 325 in the second and third regions II and III of the first substrate 100. Thus, the dielectric layer structure may be formed at the same height as that of the sacrificial layer structure 300, and may include the same structure as that of the sacrificial layer structure 300 (e.g., the first to third sacrificial layers 270, 280, and 290 sequentially stacked). For example, top surfaces of the dielectric layer structure and the sacrificial layer structure 300 may be coplanar with one another, and bottom surfaces of the dielectric layer structure and the sacrificial layer structure 300 may be coplanar with one another.

The second conductor 325 may be formed in the third region III of the first substrate 100, and may be spaced apart from a portion of the support layer 320 in the horizontal direction in the first and second regions I and II of the first substrate 100. In example embodiments, the second conductor 325 may be formed at the same height (e.g., vertical level) as that of the support layer 320, and may include the same material as that of the support layer 320, polysilicon doped with n-type impurities. For example, top surfaces of the second conductor 325 and the support layer 320 may be coplanar with one another, and bottom surfaces of the second conductor 325 and the support layer 320 may be coplanar with one another.

In example embodiments, at least a portion of the second conductor 325 may overlap the first conductor 255 in the first direction, and thus the first and second conductors 255 and 325 and a portion of the sacrificial layer structure 300 therebetween (i.e., the dielectric layer structure) may form a capacitor.

In order to increase the capacitance of the capacitor, almost all portions of the second conductor 325 may vertically overlap the first conductor 255, except for an area of the first conductor 255 for forming the fourth contact plug 545 contacting the first conductor 255. An area for forming the fifth contact plug 546 contacting the second conductor 325 may not vertically overlap the first conductor 255, and thus the fifth contact plug 546 may not contact the first conductor 255 even if the fifth contact plug 546 extends through the second conductor 325 and the sacrificial layer structure 300.

The first contact plug 542 may extend through the fifth to seventh insulating interlayers 350, 360, and 440, the insulation patterns 335, and the second blocking layer 500 to contact a corresponding one of the gate electrodes 512, 514, and 516 in the second region II of the first substrate 100, the second contact plug 543 may extend through the fifth to seventh insulating interlayers 350, 360, and 440, the support layer 320, and the sacrificial layer structure 300 to contact an upper surface of the second substrate 250 in the second region II of the first substrate 100, the third contact plug 544 may extend through the fifth to seventh insulating interlayers 350, 360, and 440, the sacrificial layer structure 300, the fourth insulating interlayer pattern 260, and the third insulating interlayer 240 to contact an upper surface of the eleventh lower wiring 228 in the third region III of the first substrate 100, the fourth contact plug 545 may extend through the fifth to seventh insulating interlayers 350, 360, and 440 and the sacrificial layer structure 300 to contact an upper surface of the first conductor 255 in the third region III of the first substrate 100, and the fifth contact plug 546 may extend through the fifth to seventh insulating interlayers 350, 360, and 440 to contact an upper surface of the second conductor 325 in the third region III of the first substrate 100.

The third contact plug 544 may extend in the first direction to electrically connect the lower circuit patterns with the upper wiring structures, and thus may be referred to as the through via.

The upper wiring structures may include, e.g., upper contact plugs, upper wirings, upper vias, etc.

The first to fifth, and the seventh upper contact plugs 572, 573, 574, 575, 576, and 579 may extend through the eighth insulating interlayer 560 on the seventh insulating interlayer 440, the division structure and the first to fifth contact plugs 542, 543, 544, 545, and 546 to contact upper surfaces of the first to fifth contact plugs 542, 543, 544, 545, and 546 and the CSP 530, respectively, and the sixth upper contact plug 578 may extend through the seventh and eighth insulating interlayers 440 and 560 to contact an upper surface of the capping pattern 430.

The first to seventh upper wirings 592, 593, 594, 595, 596, 598, and 599 may extend through the ninth insulating interlayer 580 on the eighth insulating interlayer 560 and the first to seventh upper contact plugs 572, 573, 574, 575, 576, 578, and 579 to contact upper surfaces of the first to seventh upper contact plugs 572, 573, 574, 575, 576, 578, and 579, respectively.

The first to seventh upper vias 612, 613, 614, 615, 616, 618, and 619 may extend through the tenth insulating interlayer 600 on the ninth insulating interlayer 580 and the first to seventh upper wirings 592, 593, 594, 595, 596, 598, and 599 to contact upper surfaces of the first to seventh upper wirings 592, 593, 594, 595, 596, 598, and 599, respectively.

The eighth to fourteenth upper wirings 632, 633, 634, 635, 636, 638, and 639 may extend through the eleventh insulating interlayer 620 on the tenth insulating interlayer 600 and the first to seventh upper vias 612, 613, 614, 615, 616, 618, and 619 to contact upper surfaces of the first to seventh upper vias 612, 613, 614, 615, 616, 618, and 619, respectively.

The eighth to eleventh upper vias 654, 655, 656, and 659 may extend through the twelfth insulating interlayer 640 on the eleventh insulating interlayer 620 and the eighth to fourteenth upper wirings 632, 633, 634, 635, 636, 638, and 639 to contact upper surfaces of the eighth to fourteenth upper wirings 632, 633, 634, 635, 636, 638, and 639, respectively.

The fifteenth to eighteenth upper wirings 674, 675, 676, and 679 may extend through the thirteenth insulating interlayer 660 on the twelfth insulating interlayer 640 and the eighth to eleventh upper vias 654, 655, 656, and 659 to contact upper surfaces of the eighth to eleventh upper vias 654, 655, 656, and 659, respectively.

In example embodiments, the thirteenth upper wiring 638 may extend in the third direction, and a plurality of thirteenth upper wirings 638 may be formed to be spaced apart from each other in the second direction. The thirteenth upper wiring 638 may serve as a bit line of the vertical memory device.

The vertical memory device may include the first conductor 255, the dielectric layer structure 300, and the second conductor 325 sequentially stacked in the third region III of the first substrate 100. The first and second conductors 255 and 325 may be connected to the fourth and fifth contact plugs 575 and 576, respectively, and voltages may be applied thereto via the fourth and fifth contact plugs 575 and 576. Thus, the first and second conductors 255 and 325 and the dielectric layer structure 300 may form a capacitor.

As illustrated above, the first conductor 255 of the capacitor may have a maximum area within a range in which the first conductor 255 may not contact the third contact plugs 544 in the third region III of the first substrate 100, and thus the capacitor may have a large capacitance.

FIGS. 4 to 16 are and cross-sectional views illustrating a method of manufacturing a vertical memory device in accordance with example embodiments. Specifically, FIGS. 4-8, 11-12, 14, and 16 are cross-sectional views taken along the second direction, and FIGS. 9-10, 13, and 15 are cross-sectional views taken along the third direction.

Figure 4:
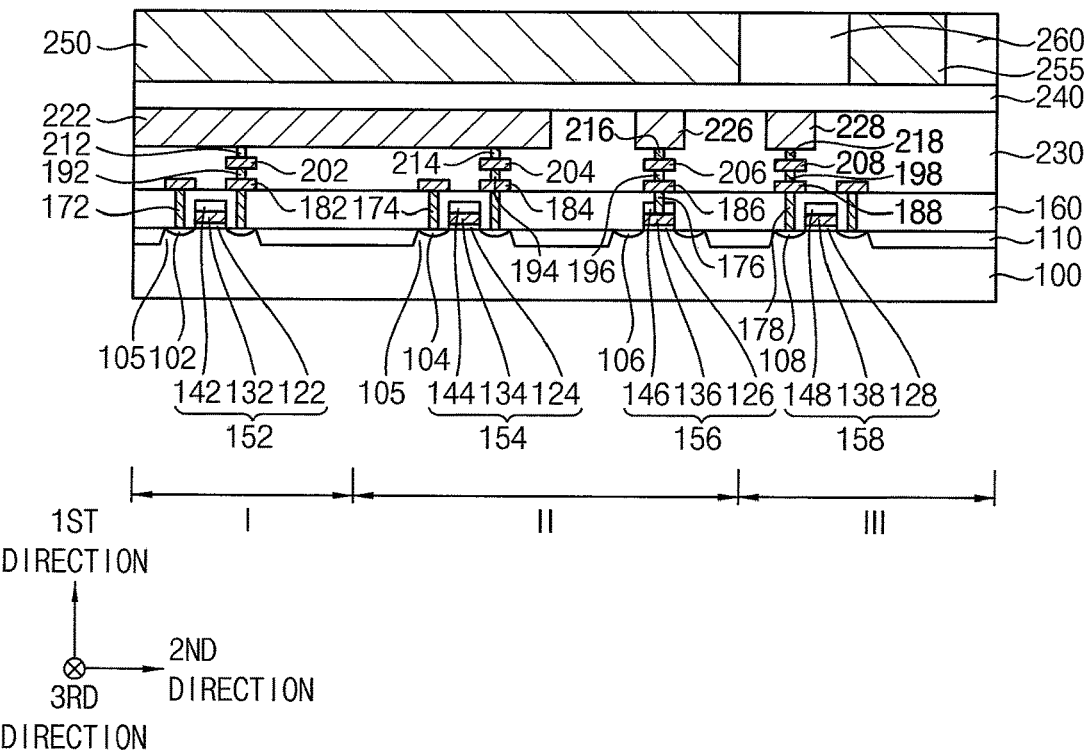
FIGS. 4 to 16 are and cross-sectional views illustrating a method of manufacturing a vertical memory device in accordance with example embodiments.

Referring to FIG. 4, lower circuit patterns may be formed on a first substrate 100, and first to third insulating interlayers 160, 230, and 240 may be sequentially formed on the first substrate 100 to cover the lower circuit patterns.

An isolation pattern 110 may be formed on the first substrate 100 by, e.g., a shallow trench isolation (STI) process, and thus an active region 105 may be defined on the first substrate 100. First to fourth impurity regions 102, 104, 106, and 108 may be formed by, e.g., an ion implantation process at upper portions of the active region 105, respectively. First to fourth lower gate structures 152, 154, 156, and 158, first to fourth lower contact plugs 172, 174, 176, and 178, first to eighth lower vias 192, 194, 196, 198, 212, 214, 216, and 218, and first to eleventh lower wirings 182, 184, 186, 188, 202, 204, 206, 208, 222, 224, 226, and 228, which may form the lower circuit patterns, may be formed by a patterning process and/or a damascene process.

The first insulating interlayer 160 may be formed on the first substrate 100 to cover the first to fourth impurity regions 102, 104, 106, and 108, and the first to fourth lower gate structures 152, 154, 156, and 158, and surround sidewalls of the first to fourth lower contact plugs 172, 174, 176, and 178. The second insulating interlayer 230 may be formed on the first insulating interlayer 160 to cover the first to eighth lower vias 192, 194, 196, 198, 212, 214, 216, and 218, and the first to eighth lower wirings 182, 184, 186, 188, 202, 204, 206, and 208, and surround sidewalls of the ninth to eleventh lower wirings 222, 226, and 228. The third insulating interlayer 240 may be formed on the second insulating interlayer 230 and the ninth to eleventh lower wirings 222, 226, and 228.

A second substrate 250 and a first conductor 255 may be formed on the third insulating interlayer 240, and a fourth insulating interlayer pattern 260 may be formed on the third insulating interlayer 240 to cover sidewalls of the second substrate 250 and the first conductor 255.

The second substrate 250 may be formed on the third insulating interlayer 240, and then may be patterned so as to remain only in the first and second regions I and II of the first substrate 100. During the etching process, a portion of the second substrate 250 in the third region III of the first substrate 100 may be also patterned to remain as the first conductor 255.

Referring to FIG. 3A, in example embodiments, the first conductor 255 may extend lengthwise in the second direction, and a plurality of first conductors 255 may be formed to be spaced apart from each other in the third direction. However, the inventive concept may not be limited thereto, and one or a plurality of first conductors 255 may be formed to have various layouts according to the layout of the through vias, that is, the third contact plugs 544. For example, the first conductor 255 may be formed to have various layouts in space where the third contact plugs 544 are not formed in the third region III of the first substrate 100.

In some embodiments, referring to FIG. 3B, the first conductor 255 may be formed to be spaced apart from each of the third contact plugs 544 by a distance d, and thus each of the third contact plugs 544 may not contact the first conductor 255 even if misalignment occurs. In example embodiments, the first conductor 255 may cover a remaining area except for an area within the distance d from each of the third contact plugs 544 in the third region III of the first substrate 100. The more area the first conductor 255 has, the more capacitance the capacitor including the first conductor 55 may have.

The fourth insulating interlayer pattern 260 may be formed on the third insulating interlayer 240 to cover the second substrate 250 and the first conductor 255, and may be planarized until upper surfaces of the second substrate 250 and the first conductor 255 are exposed. During the planarization process, the first conductor 255 may be formed in the third region III of the first substrate 100 in which the second substrate 250 is not formed, and thus dishing phenomenon may be prevented, and an upper surface of the fourth insulating interlayer pattern 260 may have a uniform height.

Figure 5:
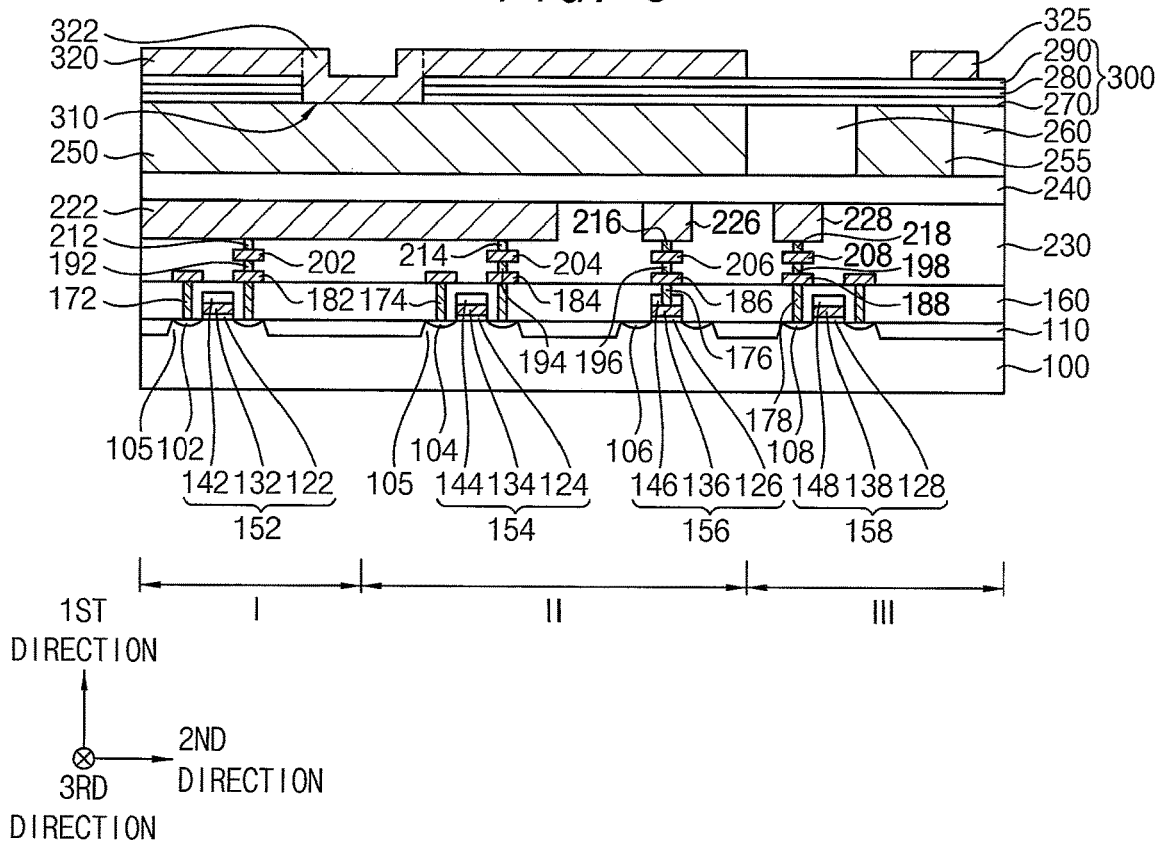

Referring to FIG. 5, a sacrificial layer structure 300 may be formed on the second substrate 250, the first conductor 255, and the fourth insulating interlayer pattern 260. Then, the sacrificial layer structure 300 may be partially removed to form a first opening 310 exposing an upper surface of the second substrate 250, and a support layer 320 may be formed on the second substrate 250, the first conductor 255, and the fourth insulating interlayer pattern 260 to at least partially till the first opening 310.

The sacrificial layer structure 300 may include first to third sacrificial layers 270, 280 and 290 sequentially stacked. The first and third sacrificial layers 270 and 290 may include an oxide, e.g., silicon oxide, and the second sacrificial layer 280 may include a nitride, e.g., silicon nitride.

The support layer 320 may include a material having etching selectivity with respect to the first to third sacrificial layers 270, 280, and 290, e.g., polysilicon doped with n-type impurities. In an example embodiment, the support layer 320 may be formed by depositing amorphous silicon doped with n-type impurities, and being crystallized by an additional heat treatment or due to heat generated by other deposition processes so as to include polysilicon doped with n-type impurities.

In example embodiments, a plurality of first openings 310 may be formed in the first and second regions I and II of the first substrate 100, and may have various layouts. For example, a plurality of first openings 310 may be formed in the second and third directions, or some of the plurality of first openings 310 may extend lengthwise in the second or third direction.

The support layer 320 may have a uniform thickness in the first direction, and thus a first recess may be formed on a portion of the support layer 320 in the first opening 310.

The portion of the support layer 320 in the first opening 310 may be referred to as a support pattern 322. For example, a thickness of the support layer 320 formed above the sacrificial layer structure 300 may be the same as a thickness of the support pattern 322 formed in the first opening 310.

A portion of the support layer 320 in the third region III of the first substrate 100 may be patterned to form a second conductor 325 in the third region III of the first substrate 100. The second conductor 325 may be spaced apart in the second and third directions from a portion of the support layer 320 in the first and second regions I and II of the first substrate 100. In example embodiments, at least a portion of the second conductor 325 may overlap the first conductor 255 in the first direction, and thus the first and second conductors 255 and 325 and a portion of the sacrificial layer structure 300 therebetween may form a capacitor.

In order to increase the capacitance of the capacitor, almost all portions of the second conductor 325 may overlap the first conductor 255, except for an area for forming a fourth contact plug 545 contacting the first conductor 255. An area for forming the fifth contact plug 546 contacting the second conductor 325 may not overlap the first conductor 255, and thus the fifth contact plug 546 may not contact the first conductor 255 even if the fifth contact plug 546 extends through the second conductor 325 and the sacrificial layer structure 300.

Figure 6:
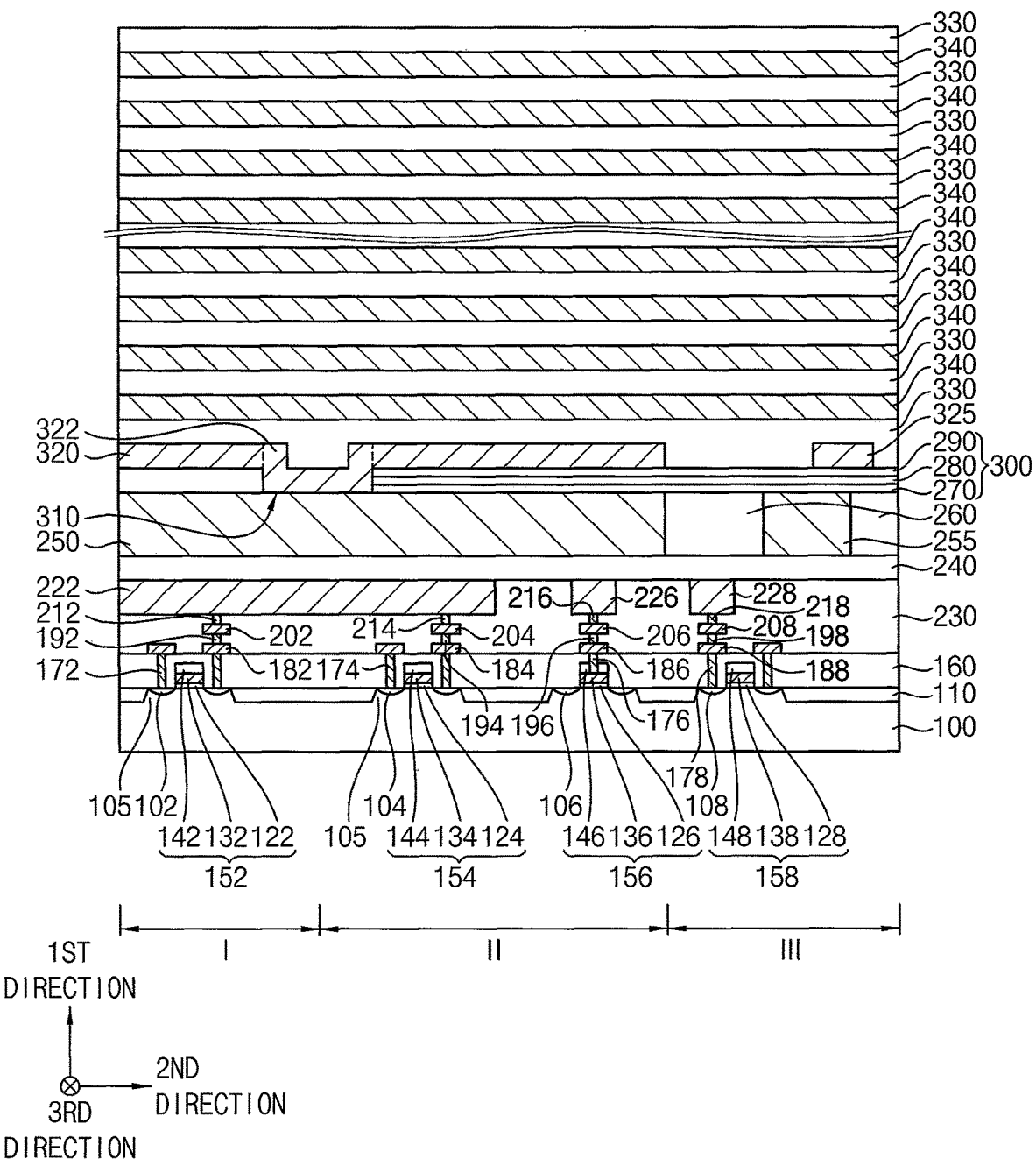

Referring to FIG. 6, an insulation layer 330 may be formed on the support layer 320, the support pattern 322, the second conductor 325, and the sacrificial layer structure 300 to fill the first recess, and an upper portion of the insulation layer 330 may be planarized. The insulation layer 330 may include an oxide, e.g., silicon oxide, and the planarization process may include a chemical mechanical polishing (CMP) process and/or an etch back process.

A fourth sacrificial layer 340 and the insulation layer 330 may be alternately and repeatedly stacked on the insulation layer 330, and thus a mold layer including the insulation layers 330 and the fourth sacrificial layers 340 alternately stacked may be formed on the support layer 320, the support pattern 322, the second conductor 325 and the sacrificial layer structure 300. The fourth sacrificial layer 340 may include a material having an etching selectivity with respect to the insulation layer 330, e.g., a nitride such as silicon nitride.

Figure 7:
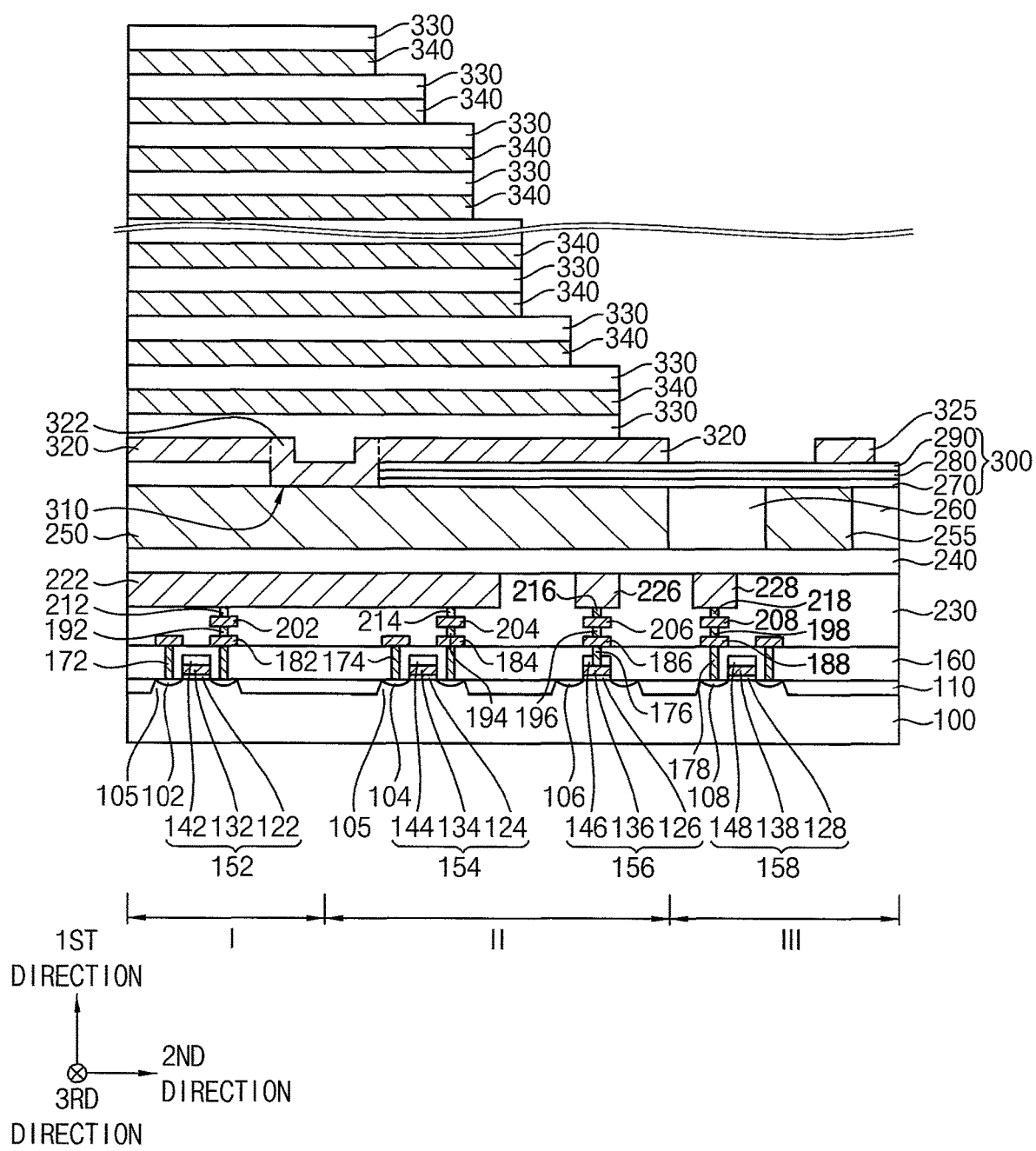

Referring to FIG. 7, a photoresist pattern (not shown) partially covering an uppermost one of the insulation layers 330 may be formed thereon, and the uppermost one of the insulation layers 330 and an uppermost one of the fourth sacrificial layers 340 thereunder may be etched using the photoresist pattern as an etching mask. Accordingly, a portion of one of the insulation layers 330 directly under the uppermost one of the fourth sacrificial layers 340 may be exposed. After a trimming process for reducing an area of the photoresist pattern by a given ratio is performed, an etching process may be performed such that the uppermost one of the insulation layers 330, the uppermost one of the fourth sacrificial layers 340, the exposed one of the insulation layers 330, and one of the fourth sacrificial layers 340 thereunder may be etched using the reduced photoresist pattern as an etching mask.

As the trimming process and the etching process are repeatedly performed, a mold including a plurality of step layers which may include the fourth sacrificial layer 340 and the insulation layer 330 sequentially stacked and having a staircase shape may be formed in the first and second regions I and II of the first substrate 100. An end portion of each of the step layers may not be overlapped with upper step layers in the first direction to be exposed, and thus may be referred to as a "step." in example embodiments, the steps of the mold may be formed in the second region II of the first substrate 100.

As the mold is formed, the second conductor 325 and a portion of the sacrificial layer structure 300 in the third region III of the first substrate 100 may be exposed.

Figure 8:
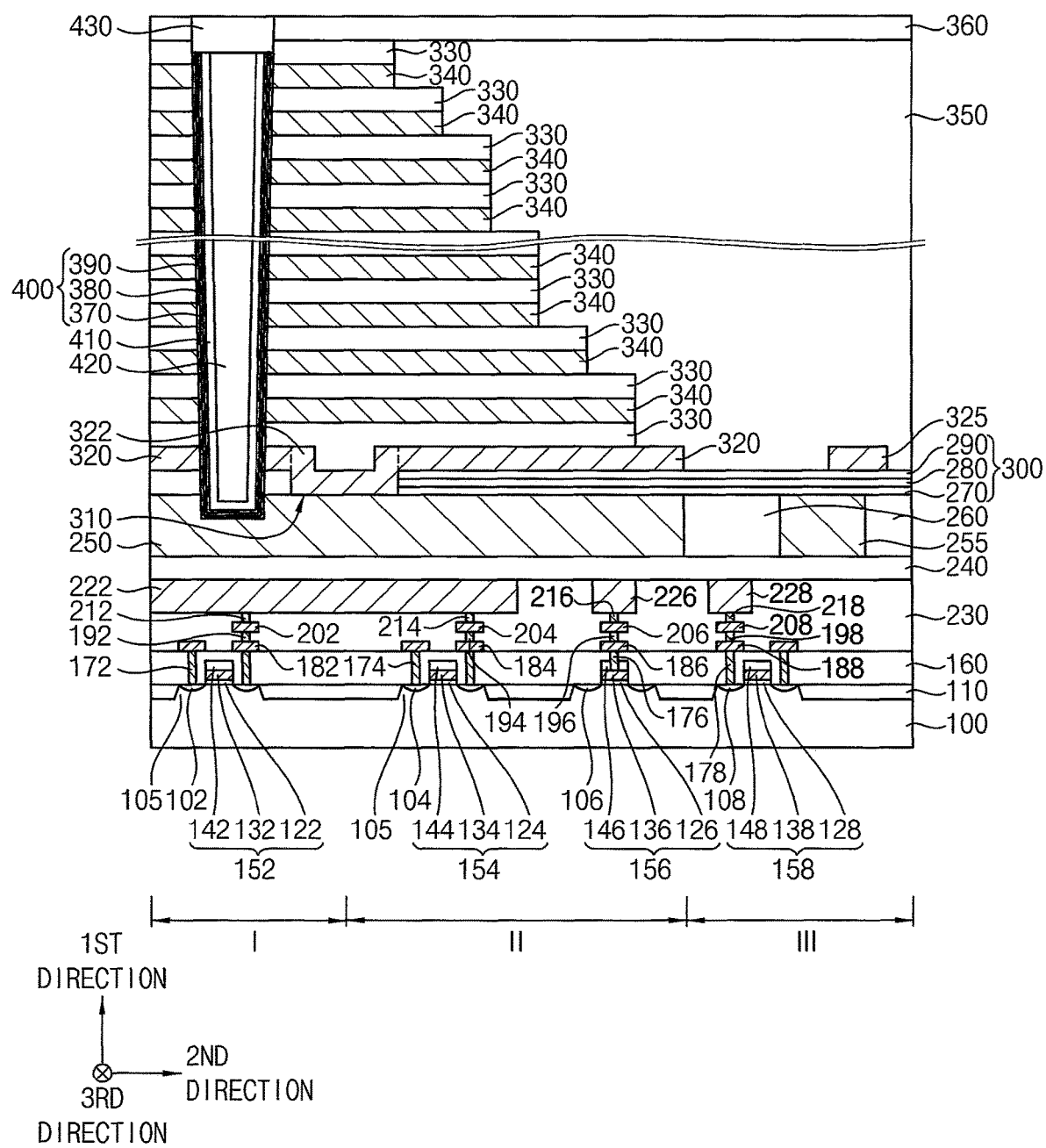

Referring to FIG. 8, a fifth insulating interlayer 350 may be formed on the mold, the second conductor 325 and the sacrificial layer structure 300, and an upper portion of the fifth insulating interlayer 350 may be planarized until an upper surface of the uppermost one of the insulation layers 330 may be exposed. For example, a top surface of the fifth insulating interlayer 350 may be coplanar with a top surface of the uppermost one of the insulation layers 330.

A sixth insulating interlayer 360 may be formed on the fifth insulating interlayer 350 and the uppermost one of the insulation layers 330, and a channel hole may be formed through the sixth insulating interlayer 360, the mold, the support layer 320, and the sacrificial layer structure 300 by, e.g., a dry etching process to expose an upper surface of the second substrate 250 in the first region I of the first substrate 100.

In example embodiments, the dry etching process may be performed until the channel hole exposes the upper surface of the second substrate 250, and further the channel hole may extend through an upper portion of the second substrate 250. In example embodiments, a plurality of channel holes may be formed in the second and third directions to form a channel hole array.

A charge storage structure 400, a channel 410, a filling pattern 420 and a capping pattern 430 may be formed in the channel hole.

Particularly, a charge storage structure layer and a channel layer may be sequentially formed on sidewalls of the channel holes, the exposed upper surface of the second substrate 250, and an upper surface of the sixth insulating interlayer 360, and a filling layer may be formed on the channel layer to fill remaining portions of the channel holes. The filling layer, the channel layer, and the charge storage structure layer may be planarized until an upper surface of the sixth insulating interlayer 360 is exposed.

By the planarization process, the charge storage structure 400 and the channel 410 having a cup-like shape may be formed on the sidewall of the channel hole and the upper surface of the second substrate 250, and the filling pattern 420 may fill an inner space formed by the channel 410.

As the channel holes form the channel hole array, the channels 410 in the channel holes, respectively, may also form a channel array.

In example embodiments, the charge storage structure 400 may include a first blocking pattern 370, a charge storage pattern 380, and a tunnel insulation pattern 390 sequentially stacked.

Upper portions of the filling pattern 420, the channel 410, and the charge storage structure 400 may be removed to form a second recess, a pad layer may be formed on the sixth insulating interlayer 360 to fill the second recess, and the pad layer may be planarized until an upper surface of the sixth insulating interlayer 360 is exposed to form the capping pattern 430.

Figure 9:
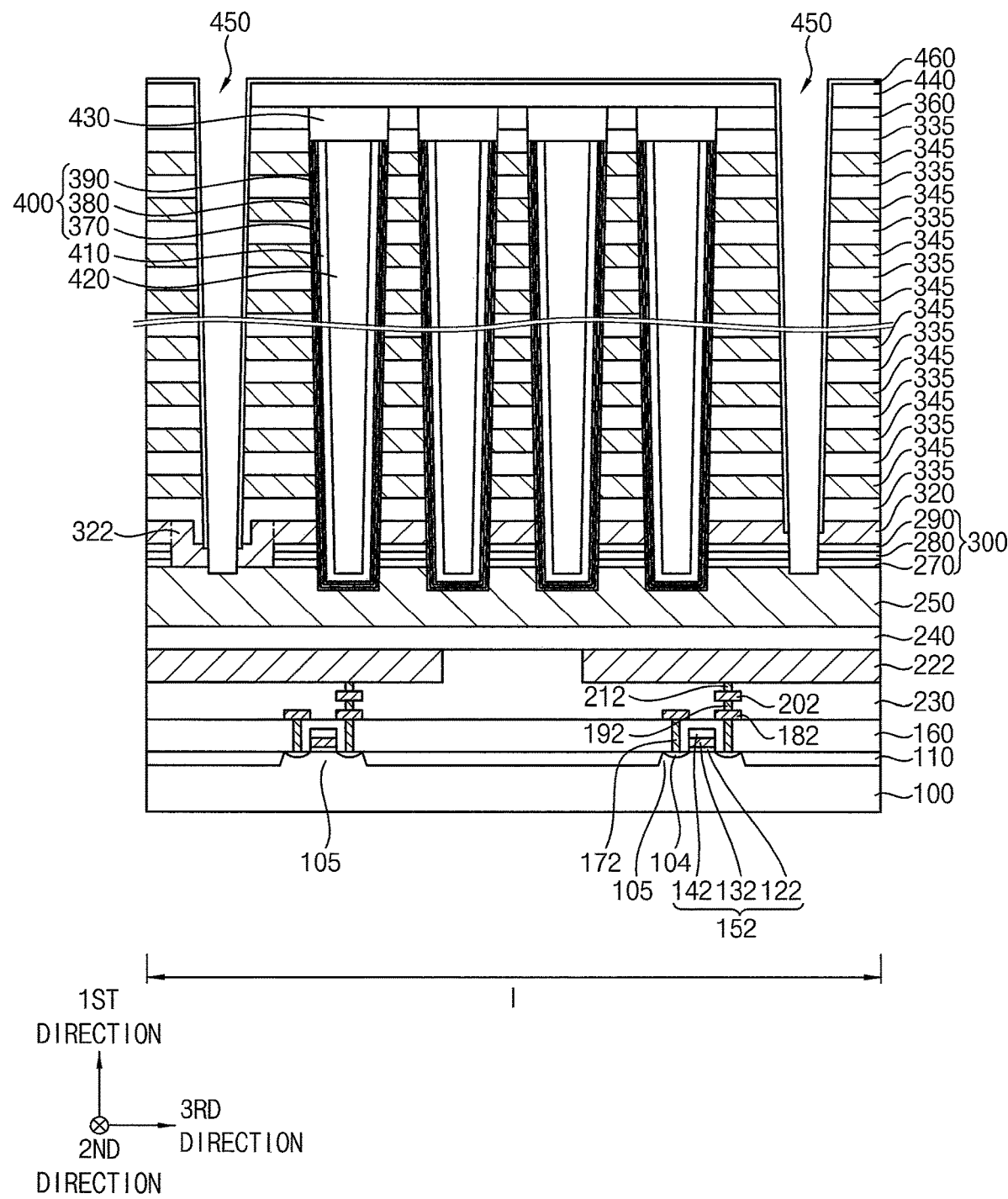

Referring to FIG. 9, a seventh insulating interlayer 440 may be formed on the sixth insulating interlayer 360 and the capping pattern 430, and a second opening 450 may be formed through the sixth and seventh insulating interlayers 360 and 440 and the mold in the first and second regions I and II of the first substrate 100 by, e.g., a dry etching process.

The dry etching process may be performed until the second opening 450 exposes an upper surface of the support layer 320 or the support pattern 322, and further the second opening 450 may extend through an upper portion of the support layer 320 or the support pattern 322. As the second opening 450 is formed, the insulation layer 330 and the fourth sacrificial layer 340 included in the mold may be exposed.

In example embodiments, the second opening 450 may extend in the second direction in the first and second regions I and II of the first substrate 100, and a plurality of second openings 450 may be formed in the third direction. As the second opening 450 is formed, the insulation layer 330 may be transformed into an insulation pattern 335 extending in the second direction, and the fourth sacrificial layer 340 may be transformed into a fourth sacrificial pattern 345 extending in the second direction.

A first spacer layer may be formed on an inner wall of the second opening 450 and an upper surface of the seventh insulating interlayer 440, and a portion of the first spacer layer on a bottom of the second opening 450 may be removed by an anisotropic etching process to form a first spacer 460, and thus upper surfaces of the support layer 320 and the support pattern 322 may be partially exposed.

The exposed portions of the support layer 320 and the support pattern 322 and a portion of the sacrificial layer structure 300 thereunder may be removed to enlarge the second opening 450 downwardly. Thus, the second opening 450 may expose an upper surface of the second substrate 250, and further the second opening 450 may extend through an upper portion of the second substrate 250.

In example embodiments, the first spacer 460 may include, e.g., undoped amorphous silicon or undoped polysilicon. However, when the first spacer 460 includes undoped amorphous silicon, it may be crystallized due to heat generated by other deposition processes so as to include undoped poly silicon.

When the sacrificial layer structure 300 is partially removed, the sidewall of the second opening 450 may be covered by the first spacer 460, and thus the insulation pattern 335 and the fourth sacrificial pattern 345 of the mold may not be removed.

Figure 10:
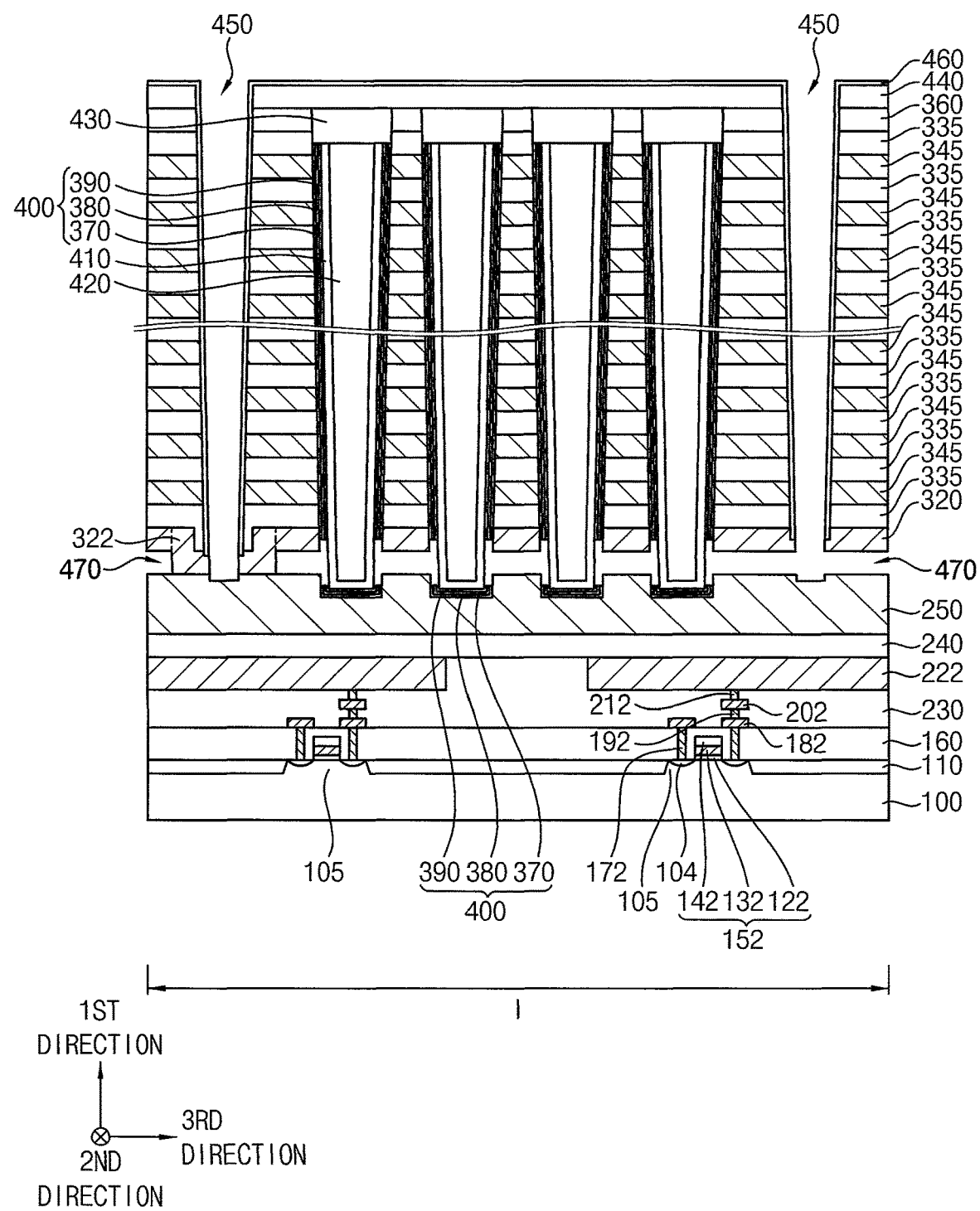
Figure 11:
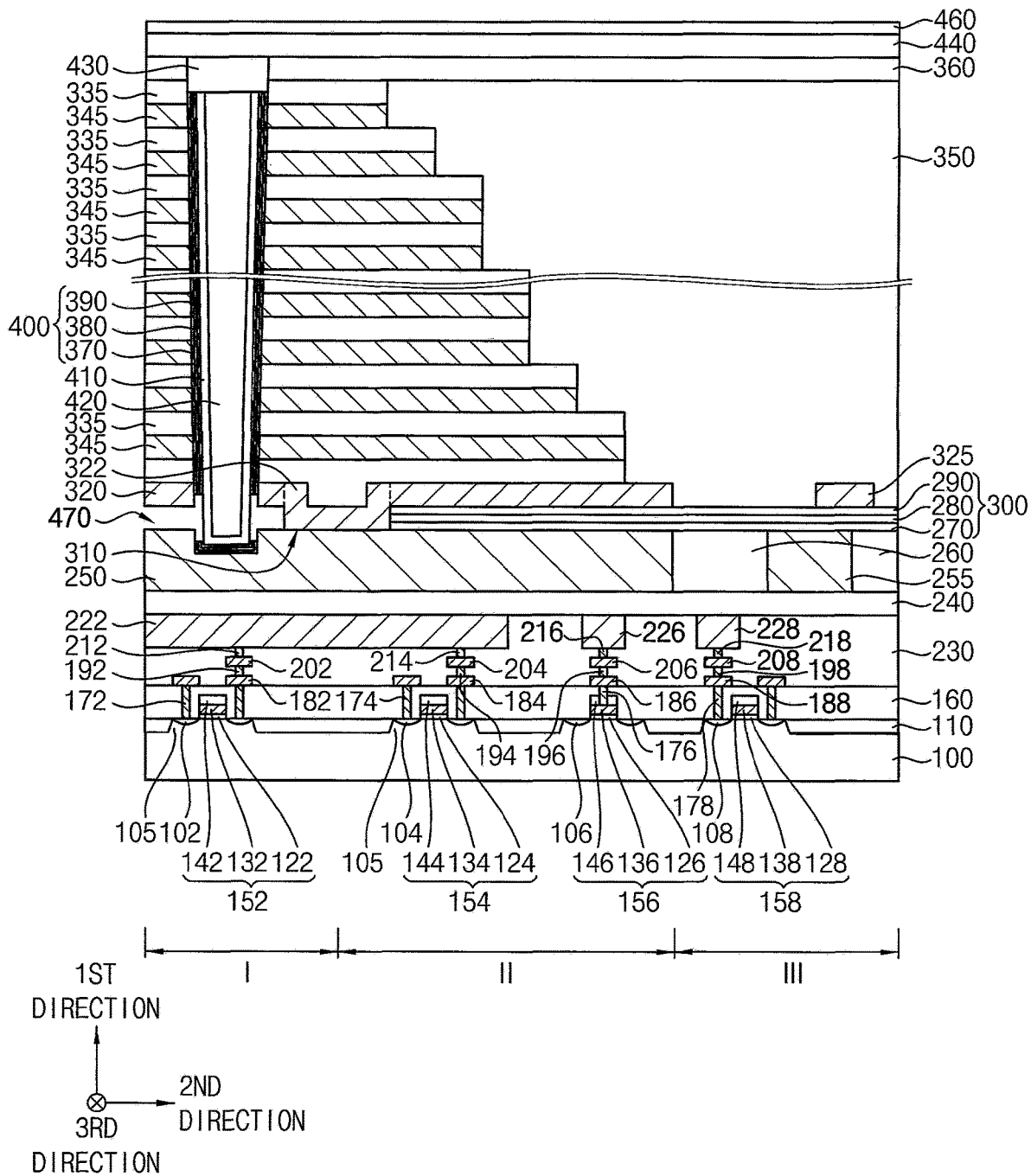

Referring to FIGS. 10 and 11, a portion of the sacrificial layer structure 300 in the first region I of the first substrate 100 may be removed by, e.g., a wet etching process through the second opening 450, and thus a first gap 470 may be formed.

In example embodiments, during the wet etching process, a portion of the sacrificial layer structure 300 in the third region III of the first substrate 100 may not be removed but remain. The portion of the sacrificial layer structure 300 in the third region III of the first substrate 100 that remains may be referred to as a dielectric layer structure hereinafter. A portion of the sacrificial layer structure 300 in the second region II of the first substrate 100 may entirely or partially remain.

The wet etching process may be performed using, e.g., hydrofluoric acid (HF) and/or phosphoric acid ($H_3PO_4$).

As the first gap 470 is formed in the first region I of the first substrate 100, a lower portion of the support layer 320 or an upper portion of the second substrate 250 adjacent to the second opening 450 may be exposed. A sidewall of the charge storage structure 400 may be partially exposed by the first gap 470, and the exposed sidewall of the charge storage structure 400 also may be removed by the wet etching process to expose an outer sidewall of the channel 410. Thus, the charge storage structure 400 may be divided into an upper (or first) portion extending through the mold to cover most portion of the outer sidewall of the channel 410 and a lower (or second) portion covering a bottom surface of the channel 410 on the second substrate 250.

When the first gap 470 is formed by the wet etching process, the support layer 320 and the support pattern 322 may not be removed so that the mold remains intact and does not collapse.

Figure 12:
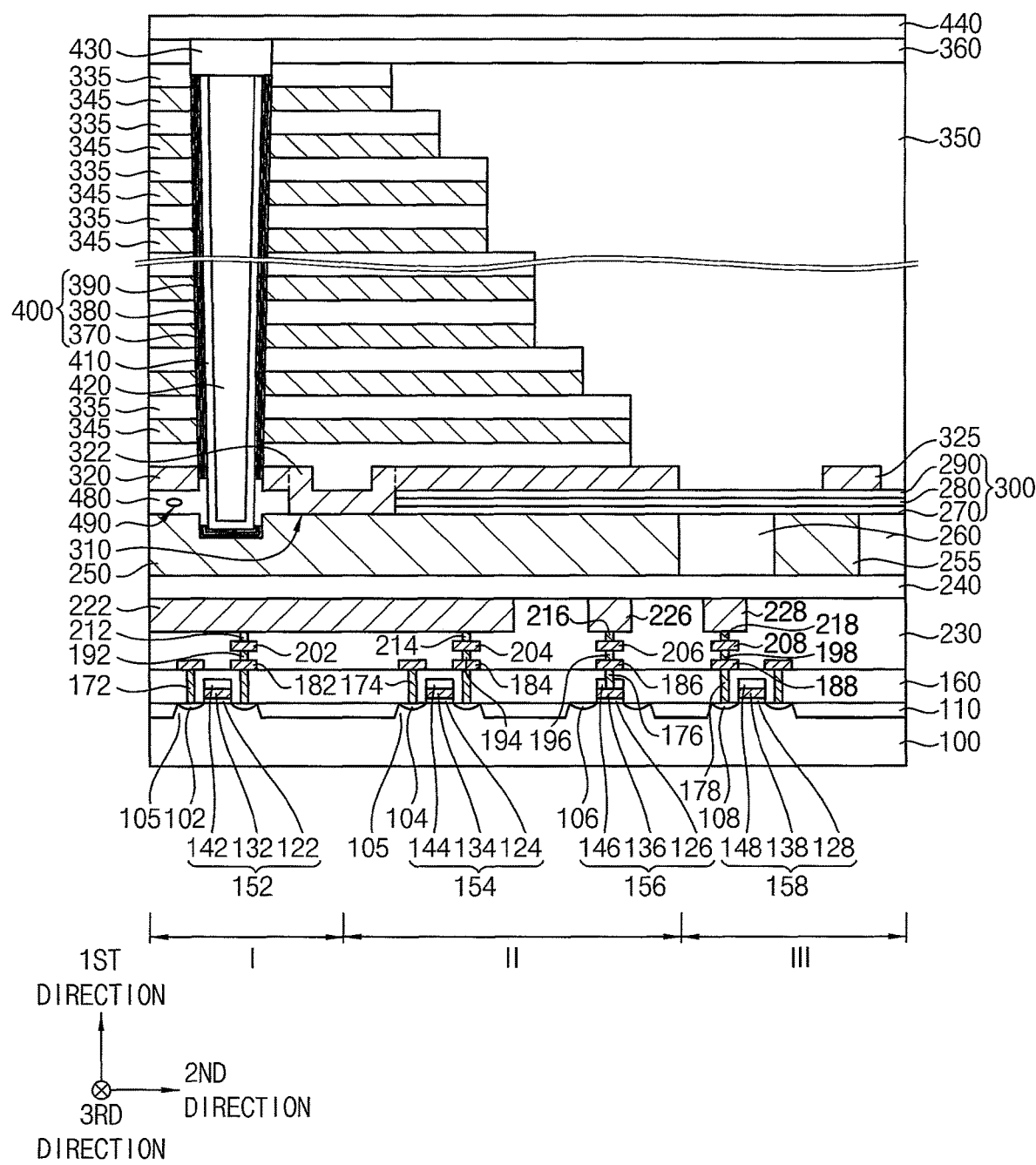
Figure 13:
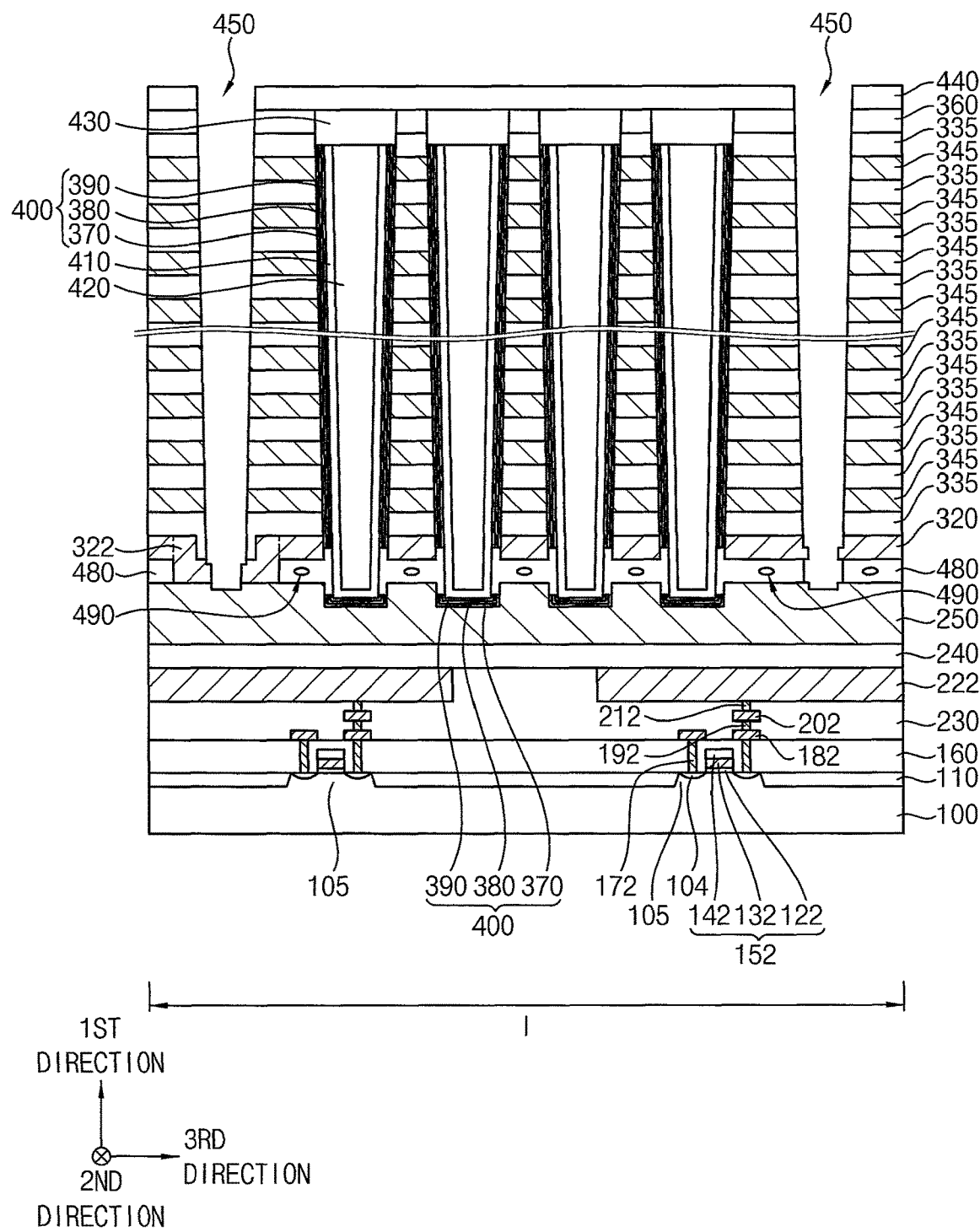

Referring to FIGS. 12 and 13, the first spacer 460 may be removed, a channel connection layer may be formed on a sidewall of the second opening 450 and in the first gap 470, and a portion of the channel connection layer in the second opening 450 may be removed by, e.g., an etch back process to form a channel connection pattern 480 in the first gap 470.

As the channel connection pattern 480 is formed, some of the channels 410 in the channel array may be connected with each other.

The channel connection pattern 480 may include, e.g., amorphous silicon doped with n-type impurities, and may be crystallized through heat generated by other deposition processes to include polysilicon doped with n-type impurities.

An air gap 490 may be formed in the channel connection pattern 480.

Figure 14:
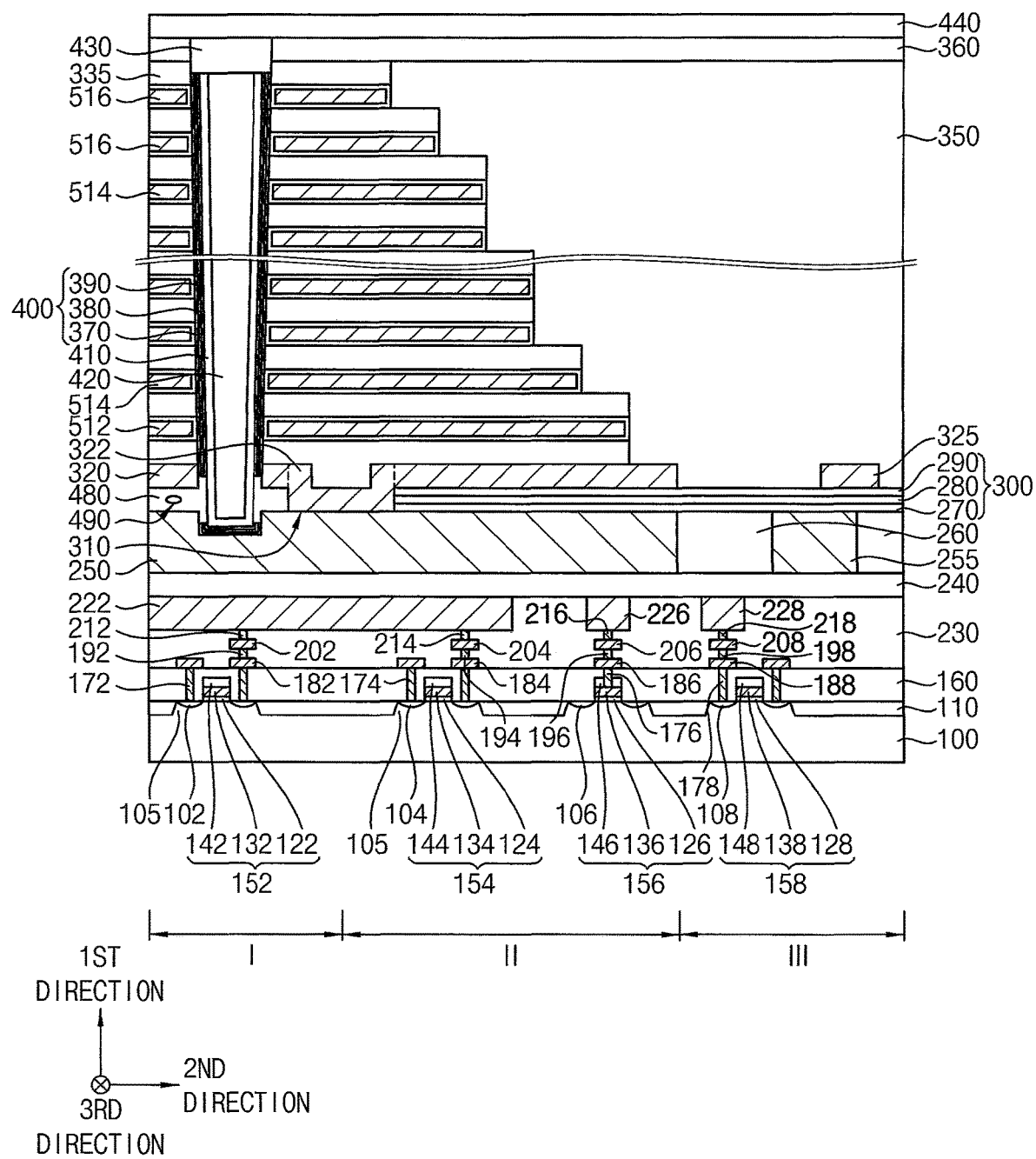
Figure 15:
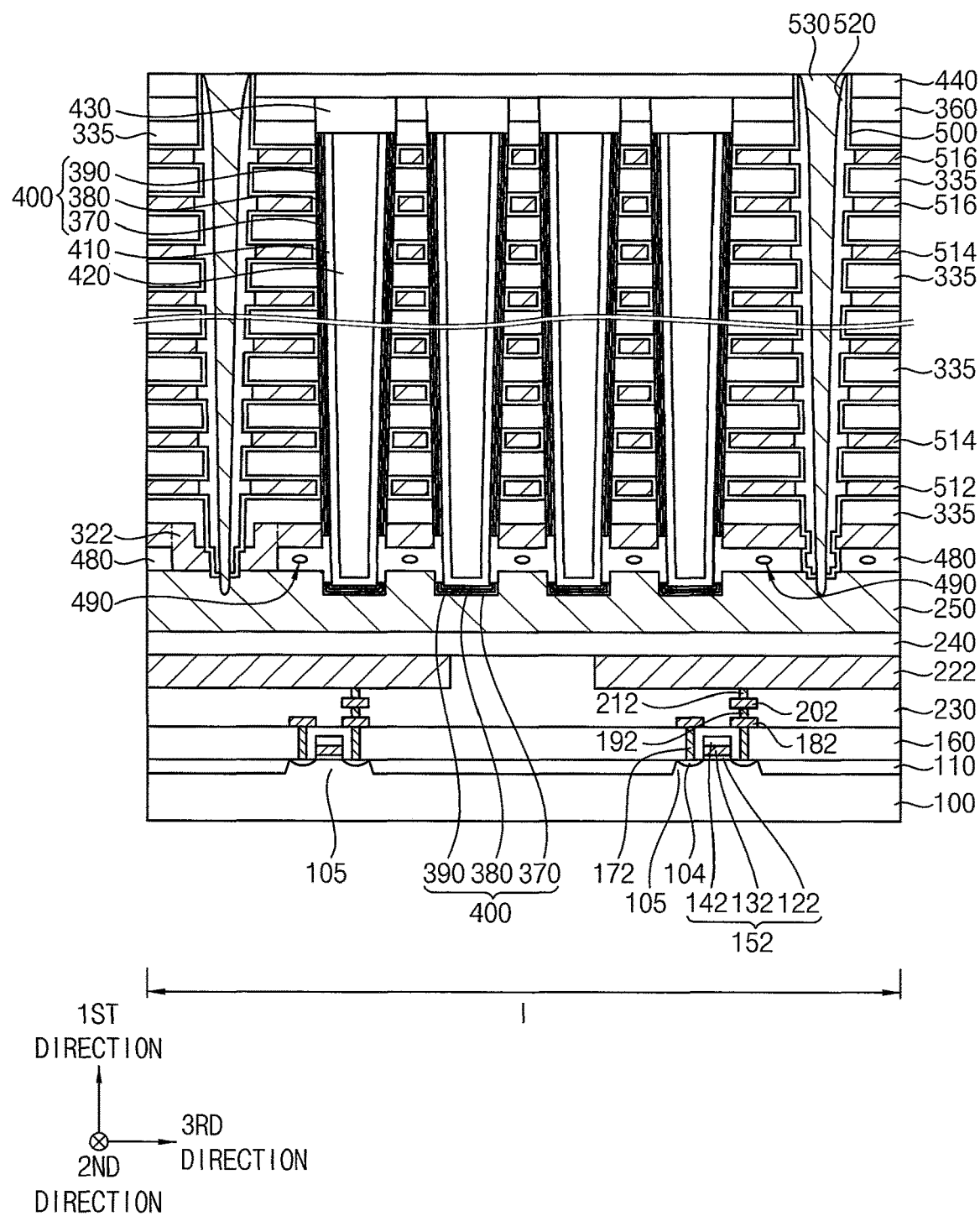

Referring to FIGS. 14 and 15, the fourth sacrificial patterns 345 exposed by the second opening 450 may be removed to form a second gap between the insulation patterns 335 at respective levels, and an outer sidewall of the first blocking pattern 370 may be partially exposed by the second gap.

In example embodiments, the fourth sacrificial patterns 345 may be removed by a wet etching process using, e.g., phosphoric acid ($H_3PO_4$) or sulfuric acid ($H_2SO_4$).

A second blocking layer 500 may be formed on the exposed outer sidewall of the first blocking pattern 370, inner walls of the second gaps, surfaces of the insulation patterns 335, a sidewall and a lower surface of the support layer 320, a sidewall of the support pattern 322, a sidewall of the channel connection pattern 480, an upper surface of the second substrate 250, and an upper surface of the seventh insulating interlayer 440. A gate electrode layer may be formed on the second blocking layer 500.

The gate electrode layer may include a gate barrier layer and a gate conductive layer sequentially stacked.

The gate electrode layer may be partially removed to form a gate electrode in each of the second gaps. In example embodiments, the gate electrode layer may be partially removed by a wet etching process.

In example embodiments, the gate electrode may extend lengthwise in the second direction, and a plurality of gate electrodes may be formed to be spaced apart from each other in the third direction. Additionally, a plurality of gate electrodes may be formed in the third direction. That is, a plurality of gate electrodes at the same level may be spaced apart from each other in the third direction by the second opening 450. The gate electrodes may include first, second and third gate electrodes 512, 514, and 516 sequentially stacked in the first direction.

A second spacer 520 may be formed on a sidewall of the second opening 450, and a common source pattern (CSP) 530 may be formed to fill a remaining portion of the second opening 450.

The second spacer 520 may be formed by forming a second spacer layer on the exposed upper surface of the second substrate 250, the sidewall of the second opening 450, and the upper surface of the seventh insulating interlayer 440, and anisotropically etching the second spacer layer so as to be formed on the sidewall of the second opening 450. The CSP 530 may be formed by forming a CSP layer on the exposed upper surface of the second substrate 250, the second spacer 520, and the seventh insulating interlayer 440, and planarizing an upper portion of the CSP layer until the upper surface of the seventh insulating interlayer 440 is exposed.

In example embodiments, the CSP 530 may extend lengthwise in the second direction, and the CSP 530 and the second spacer 520 may divide each of the first to third gate electrodes 512, 514, and 516 in the third direction.

Figure 16:
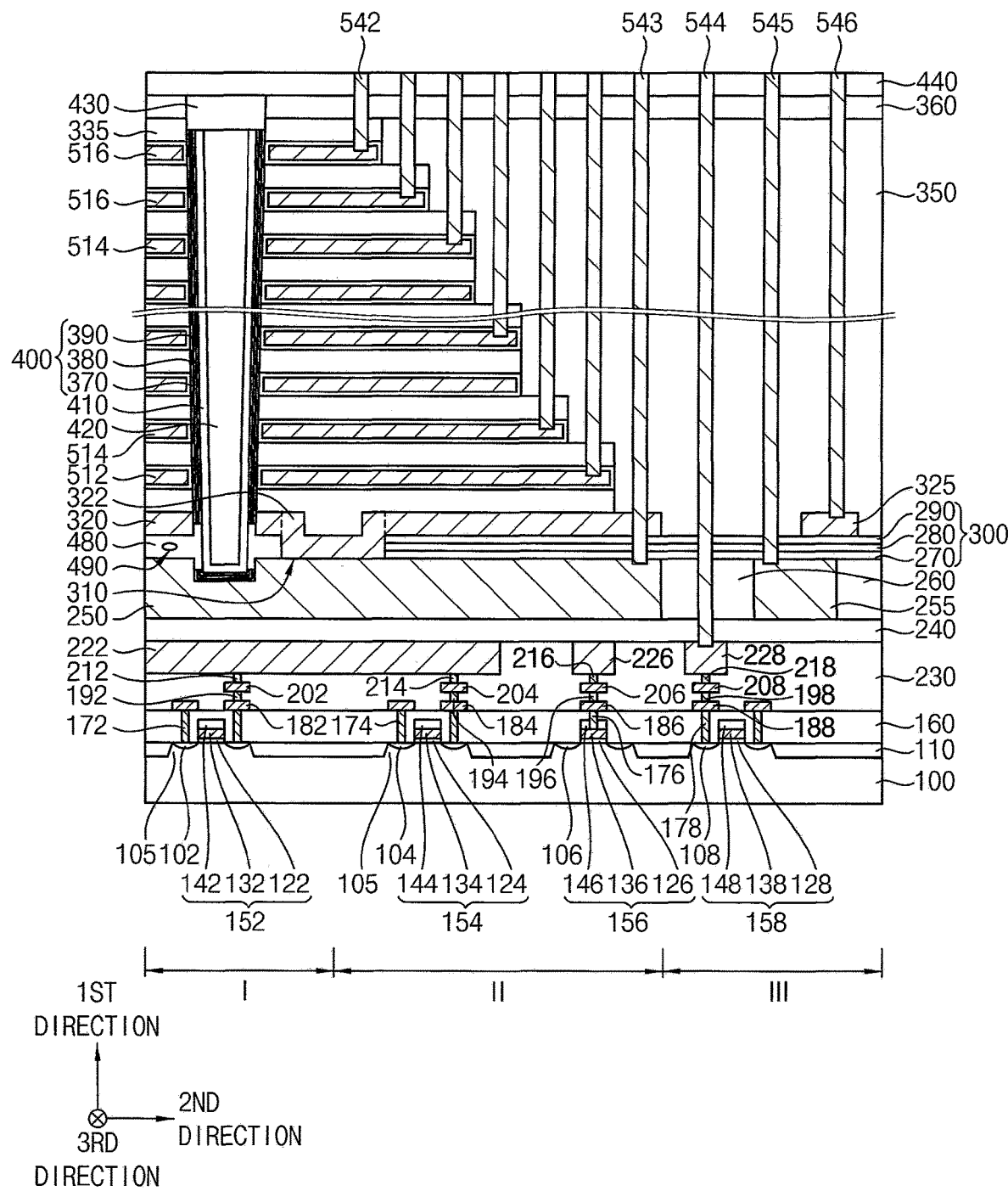

Referring to FIG. 16, a first contact plug 542 may be formed to extend through the fifth to seventh insulating interlayers 350, 360, and 440, the insulation patterns 335, and the second blocking layer 500 to contact a corresponding one of the first to third gate electrodes 512, 514, and 516 in the second region II of the first substrate 100; a second contact plug 543 may be formed to extend through the fifth to seventh insulating interlayers 350, 360, and 440, the support layer 320, and the sacrificial layer structure 300 to contact an upper surface of the second substrate 250 in the second region III of the first substrate 100; a third contact plug 544 may be formed to extend through the fifth to seventh insulating interlayers 350, 360, and 440, the sacrificial layer structure 300, the fourth insulating interlayer pattern 260, and the third insulating interlayer 240 to contact an upper surface of the eleventh lower wiring 228 in the third region III of the first substrate 100; a fourth contact plug 545 may be formed to extend through the fifth to seventh insulating interlayers 350, 360, and 440 and the sacrificial layer structure 300 to contact an upper surface of the first conductor 255 in the third region III of the first substrate 100; and a fifth contact plug 546 may be formed to extend through the fifth to seventh insulating interlayers 350, 360, and 440 to contact an upper surface of the second conductor 325 in the third region III of the first substrate 100.

Referring to FIGS. 1 and 2 again, eighth to thirteenth insulating interlayers 560, 580, 600, 620, 640, and 660 may be formed on the seventh insulating interlayer 440, the CSP 530, and the first to fifth contact plugs 542, 543, 544, 545, and 546. First to seventh upper contact plugs 572, 573, 574, 575, 576, 578, and 579, first to eighteenth upper wirings 592, 593, 594, 595, 596, 598, 599, 632, 633, 634, 635, 636, 638, 639, 674, 675, 676, and 679, and first to eleventh upper vias 612, 613, 614, 615, 616, 618, 619, 654, 655, 656, and 659 may be formed through some of the eighth to thirteenth insulating interlayers 560, 580, 600, 620, 640, and 660 to be electrically connected to the first to fifth contact plugs 542, 543, 544, 545, and 546, the capping pattern 430, and the CSP 530.

As illustrated above, the portion of the second substrate 250 in the third region III of the first substrate 100 may be patterned to form the first conductor 255, the sacrificial layer structure 300 for forming the channel connection pattern 480 may remain as the dielectric layer structure 300 in the third region III of the first substrate 100, and a portion of the support layer 320 may be patterned in the third region III of the first substrate 100 to form the second conductor 325. The first and second conductors 255 and 325 may contact the fourth and fifth contact plugs 545 and 546, respectively, and voltages may be applied to the first and second conductors 255 and 325 through the fourth and fifth contact plugs 545 and 546. Thus, the capacitor including the first and second conductors 255 and 325 and the dielectric layer structure 300 may be formed in the third region III of the first substrate 100.

Figure 17:
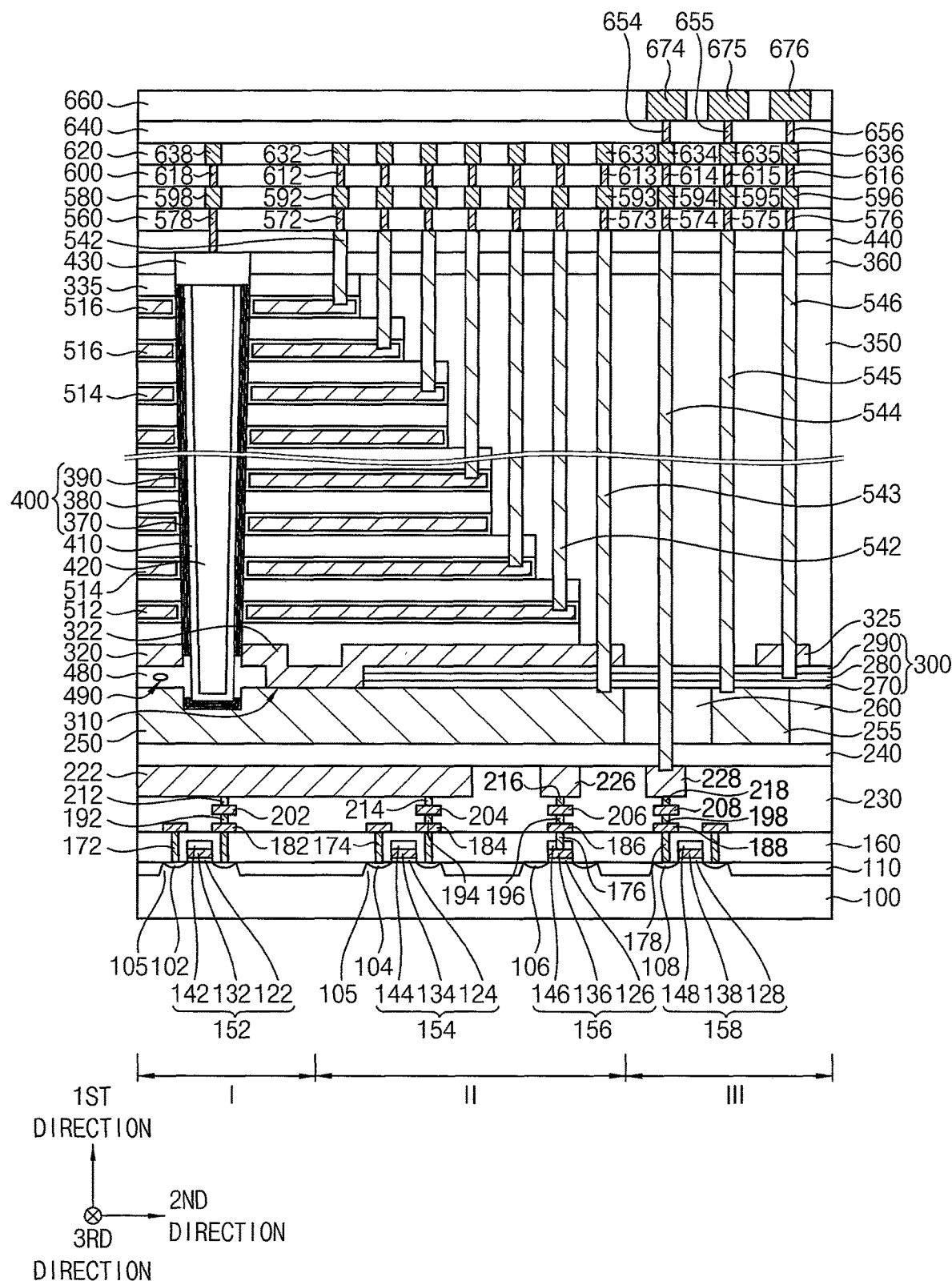
FIGS. 17 and 18 are cross-sectional views illustrating a vertical memory device in accordance with example embodiments.
Figure 18:
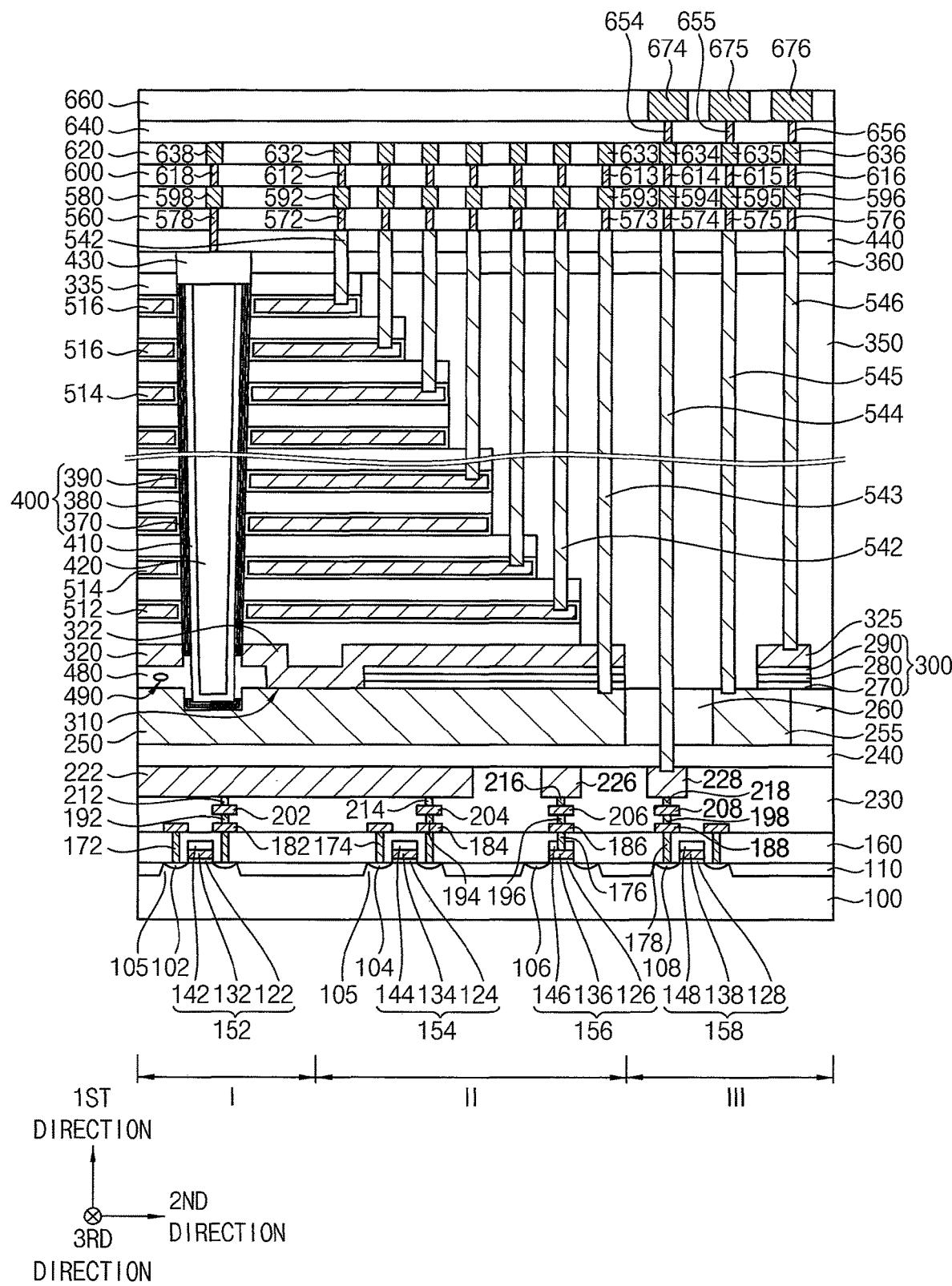

FIGS. 17 and 18 are cross-sectional views illustrating a vertical memory device in accordance with example embodiments. This vertical memory device may be substantially the same as or similar to that of FIGS. 1 to 3, except for some elements, and repetitive descriptions thereon are omitted herein.

Referring to FIG. 17, the fifth contact plug 546 may extend through the second conductor 325 to contact the dielectric layer structure 300. In some embodiments, the fifth contact plug 546 may also extend through the dielectric layer structure 300 to contact the fourth insulating interlayer pattern 260 or the lower insulating interlayer structure.

Referring to FIG. 18, the sacrificial layer structure 300 may not extend over the second and third regions II and III of the first substrate 100, but may be formed in each of the second and third regions II and III of the first substrate 100 to be spaced apart from each other. The dielectric layer structure 300 may remain only under the second conductor 325 in the third region III of the first substrate 100.

Figure 19:
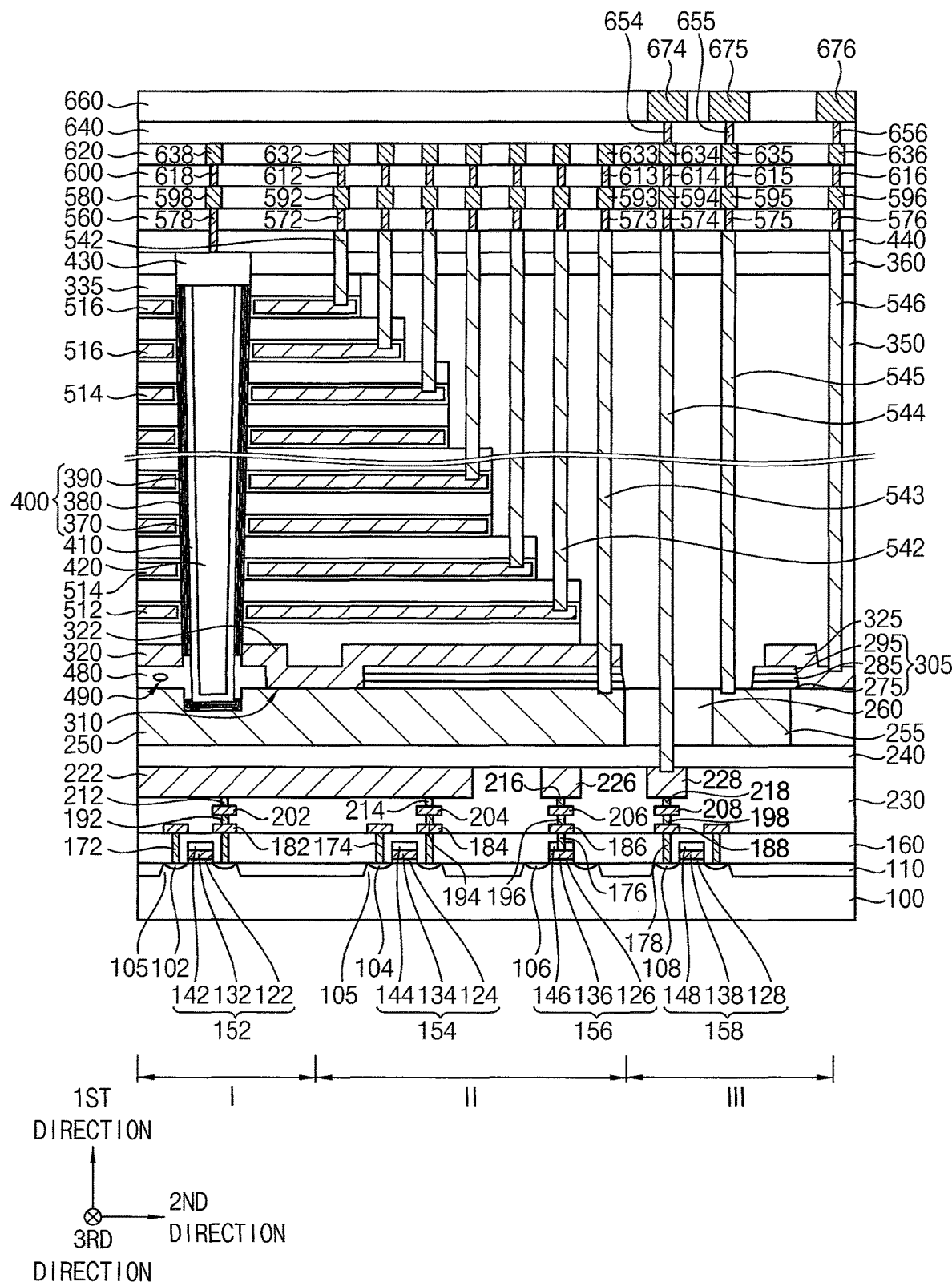
FIG. 19 is a cross-sectional view illustrating a vertical memory device in accordance with example embodiments.

FIG. 19 is a cross-sectional view illustrating a vertical memory device in accordance with example embodiments. This vertical memory device may be substantially the same as or similar to that of FIGS. 1 to 3, except for some elements, and repetitive descriptions thereon are omitted herein.

Referring to FIG. 19, the sacrificial layer structure 300 may not extend over the second and third regions II and III of the first substrate 100, but may be formed in each of the second and third regions II and III of the first substrate 100 to be spaced apart from each other. Additionally, a dielectric pattern structure 305 may remain under the second conductor 325 in the third region III of the first substrate 100.

The dielectric pattern structure 305 may include first, second, and third patterns 275, 285, and 295 sequentially stacked. The fifth contact plug 546 may contact a portion of the second conductor 325 on an upper surface of the fourth insulating interlayer pattern 260.

Figure 20:
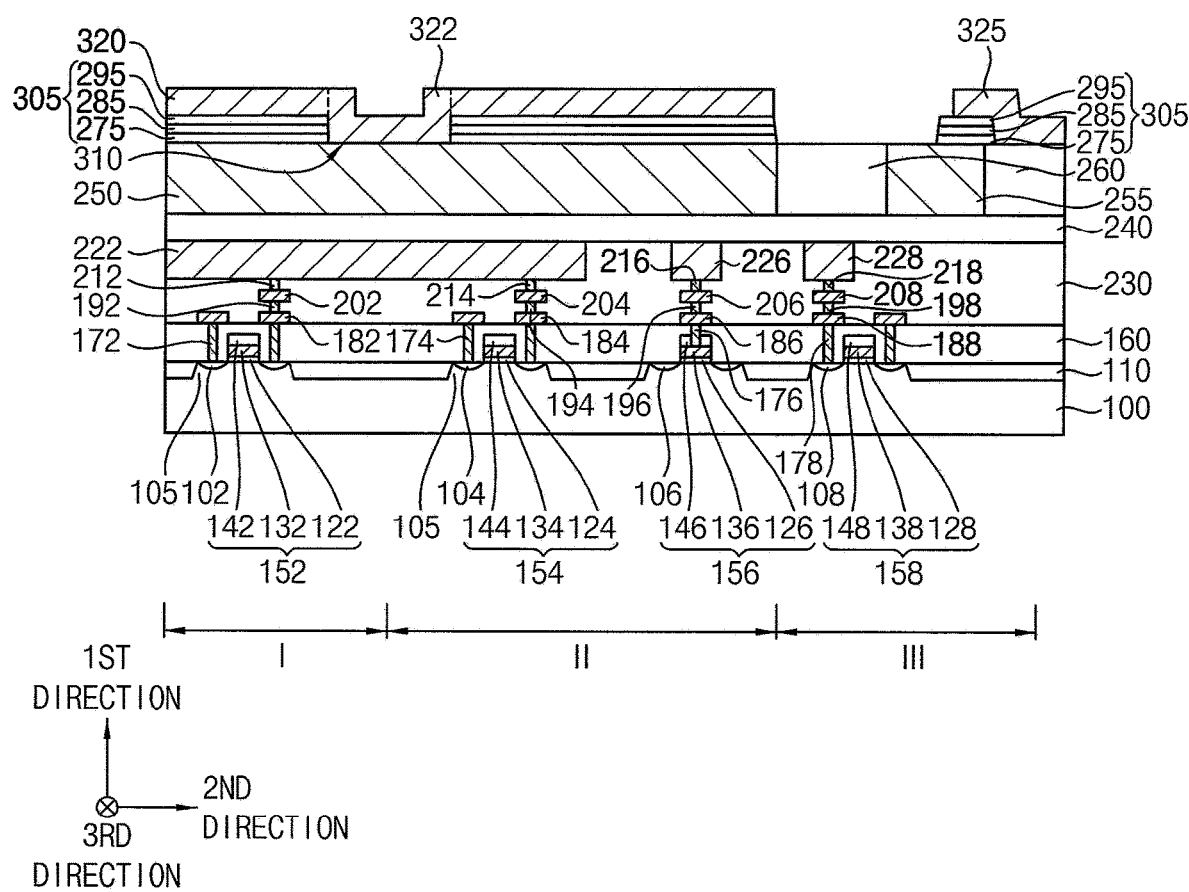
FIG. 20 is a cross-sectional view illustrating a method of manufacturing a vertical memory device in accordance with example embodiments.

FIG. 20 is a cross-sectional view illustrating a method of manufacturing a vertical memory device in accordance with example embodiments. This method may include processes substantially the same as or similar to those illustrated with reference to FIGS. 4 to 16 and FIGS. 1 and 2, and repetitive descriptions thereon are omitted herein.

Referring to FIG. 20, processes substantially the same as or similar to those illustrated with reference to FIGS. 4 to 5 may be performed. However, a portion of the sacrificial layer structure 300 in the third region III of the first substrate 100 may be patterned so that a dielectric pattern structure 305 may be formed to at least partially overlap the first conductor 255 in the first direction and be spaced apart from a portion of the sacrificial layer structure 300 in the second region II of the first substrate 100.

After forming the support layer 320, a portion of the support layer 320 in the third region III of the first substrate 100 may be patterned to form the second conductor 325 on an upper surface and a sidewall of the dielectric pattern structure 305 and an upper surface of the fourth insulating interlayer pattern 260.

Referring to FIG. 19 again, processes substantially the same as or similar to those illustrated with reference to FIGS. 6 to 16 and FIGS. 1 and 2 may be performed to complete the fabrication of the vertical memory device.

Figure 21:
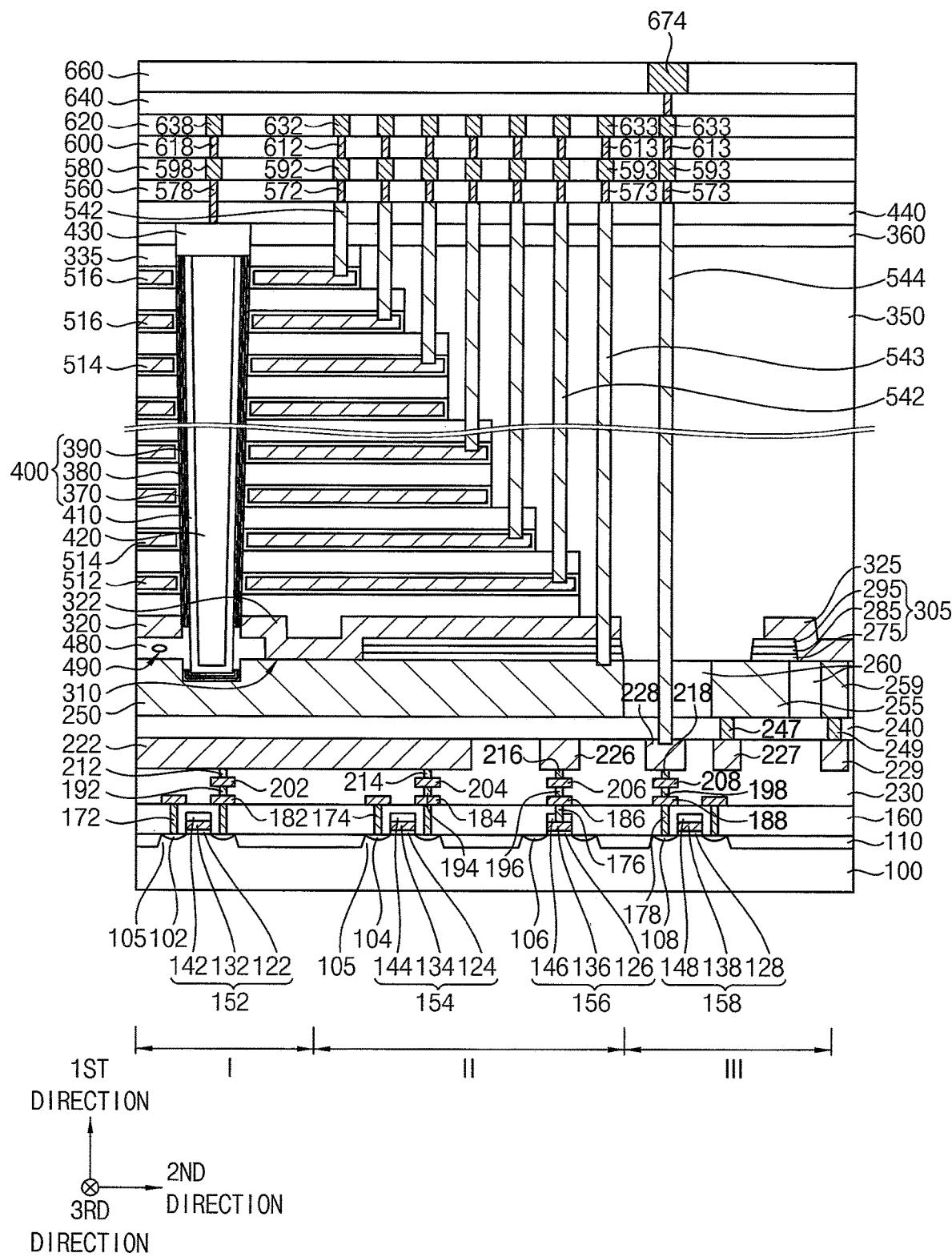
FIG. 21 is a cross-sectional view illustrating a vertical memory device in accordance with example embodiments.

FIG. 21 is a cross-sectional view illustrating a vertical memory device in accordance with example embodiments.

This vertical memory device may be substantially the same as or similar to that with reference to FIG. 19, and thus repetitive descriptions thereon are omitted herein.

Referring to FIG. 21, the fourth and fifth contact plugs 545 and 546 contacting the upper surfaces of the first and second conductors 255 and 325, respectively, and the upper wiring structures connected thereto may not be formed.

However, a third conductor 259 may be formed in the fourth insulating interlayer pattern 260 to contact a lower surface of the second conductor 325, ninth and tenth lower vias 247 and 249 may be formed in the third insulating interlayer 240 to contact lower surfaces of the first and third conductors 255 and 259, respectively, and twelfth and thirteenth lower wirings 227 and 229 may be formed at upper portions of the second insulating interlayer 230 to contact lower surfaces of the ninth and tenth lower vias 247 and 249, respectively.

Thus, in a capacitor including the first conductor 255, the dielectric pattern structure 305 and the second conductor 325, the first conductor 255 may be electrically connected to the ninth lower via 247 and the twelfth lower wiring 227, and the second conductor 325 may be electrically connected to the tenth lower via 249 and the thirteenth lower wiring 229.

As described above, although the present invention has been described with reference to example embodiments, those skilled in the art will readily appreciate that many modifications are possible in the example embodiments without materially departing from the novel teachings and advantages of the present inventive concept.

What is claimed is:

1. A vertical memory device, comprising:
   lower circuit patterns on a first substrate including a first region, a second region at least partially surrounding the first region, and a third region at least partially surrounding the second region, memory cells being formed in the first region, contact plugs transferring electrical signals to the memory cells being formed in the second region, and through vias transferring electrical signals to the lower circuit patterns being formed in the third region;
   a second substrate on the lower circuit patterns in the first and second regions of the first substrate;
   a capacitor on the lower circuit patterns in the third region of the first substrate, the capacitor including:
      a first conductor spaced apart from the second substrate, the first conductor being at a height substantially the same as that of the second substrate;
      a dielectric layer structure on the first conductor; and
      a second conductor on the dielectric layer structure;
   gate electrodes spaced apart from each other on the second substrate in the first and second regions of the first substrate in a vertical direction substantially perpendicular to an upper surface of the first substrate;
   a channel extending lengthwise through the gate electrodes in the vertical direction in the first region of the first substrate; and
   a sacrificial layer structure at a height substantially the same as that of the dielectric layer structure on the second substrate in the second region of the first substrate, the sacrificial layer structure being spaced apart from the dielectric layer structure and including a material substantially the same as that of the dielectric layer structure.

2. The vertical memory device of claim 1, wherein the first conductor includes a material substantially the same as that of the second substrate.

3. The vertical memory device of claim 2, wherein the second substrate and the first conductor include doped polysilicon.

4. The vertical memory device of claim 1, wherein the dielectric layer structure includes first, second, and third layers sequentially stacked in the vertical direction, and the first, second, and third layers include an oxide, a nitride, and an oxide, respectively.

5. The vertical memory device of claim 1, wherein the dielectric layer structure extends in a horizontal direction substantially parallel to the upper surface of the first substrate to be formed in the second region of the first substrate.

6. The vertical memory device of claim 1, further comprising:
   a plurality of channels spaced apart from each other in the first region of the first substrate, and
   a channel connection pattern under the gate electrodes on the second substrate, the channel connection pattern connecting the plurality of channels with each other.

7. The vertical memory device of claim 6, wherein the channel connection pattern is at a height substantially the same as that of the dielectric layer structure.

8. The vertical memory device of claim 6, further comprising a support layer between the channel connection pattern and the gate electrodes, the support layer including doped polysilicon.

9. The vertical memory device of claim 8, wherein the second conductor is spaced apart from the support layer, and is formed at a height substantially the same as that of the support layer and includes a material substantially the same as that of the support layer.

10. The vertical memory device of claim 1, wherein a portion of the first conductor does not overlap the second conductor in the vertical direction.

11. The vertical memory device of claim 10, further comprising:
   a first contact plug contacting an upper surface of the first conductor and extending lengthwise in the vertical direction; and
   a second contact plug contacting an upper surface of the second conductor and extending lengthwise in the vertical direction.

12. The vertical memory device of claim 11, wherein the first contact plug contacts the portion of the first conductor that does not overlap the second conductor in the vertical direction.

13. The vertical memory device of claim 11, wherein the first contact plug extends through the dielectric layer structure.

14. The vertical memory device of claim 11, wherein the first contact plug does not contact the dielectric layer structure.

15. The vertical memory device of claim 1, further comprising:
   an insulating interlayer pattern covering sidewalls of the second substrate and the first conductor in the third region of the first substrate,
   wherein the second conductor is formed on an upper surface and a sidewall of the dielectric layer structure and on an upper surface of the insulating interlayer pattern.

16. A vertical memory device, comprising:
   gate electrodes spaced apart from each other on a substrate in a vertical direction substantially perpendicular to an upper surface of the substrate;
   channels extending through the gate electrodes in the vertical direction on the substrate;

a channel connection pattern under the gate electrodes on the substrate, the channel connection pattern contacting lower portions of the channels so as to connect the channels with each other;

a capacitor including:
- a first conductor spaced apart from the substrate in a horizontal direction substantially parallel to the upper surface of the substrate;
- a dielectric layer structure including first, second, and third layers sequentially stacked on the first conductor, the first, second, and third layers including an oxide, a nitride, and an oxide, respectively; and
- a second conductor on the dielectric layer structure;

a first contact plug contacting an upper surface of the first conductor extending lengthwise in the vertical direction; and a second contact plug contacting an upper surface of the second conductor and extending lengthwise in the vertical direction, wherein the dielectric layer structure and the channel connection pattern are formed at a height substantially the same as each other.

17. The vertical memory device of claim 16, further comprising:
- a first contact plug contacting the first conductor and extending in the vertical direction; and
- a second contact plug contacting the second conductor and extending in the vertical direction.

18. A vertical memory device, comprising:

transistors on a first substrate;

lower circuit patterns on the first substrate, the lower circuit patterns being electrically connected to the transistors;

an insulating interlayer on the first substrate, the insulating interlayer covering the transistors and the lower circuit patterns;

a second substrate on the insulating interlayer;

a capacitor on the insulating interlayer, the capacitor including:
- a first conductor spaced apart from the second substrate, the first conductor being at a height substantially the same as that of the second substrate;
- a dielectric layer structure on the first conductor; and
- a second conductor on the dielectric layer structure;

gate electrodes spaced apart from each other on the second substrate in a vertical direction substantially perpendicular to an upper surface of the first substrate; and channels extending through the gate electrodes in the vertical direction on the second substrate;

a charge storage structure on an outer sidewall of each of the channels;

upper wirings on the gate electrodes, the upper wirings being electrically connected to the gate electrodes, respectively;

a first contact plug electrically connected to the first conductor;

a second contact plug electrically connected to the second conductor;

a through via spaced apart from the capacitor in a horizontal direction substantially parallel to the upper surface of the first substrate, the through via being electrically connected to the lower circuit patterns; and a sacrificial layer structure at a height substantially the same as that of the dielectric layer structure on the second substrate, the sacrificial layer structure being spaced apart from the dielectric layer structure and including a material substantially the same as that of the dielectric layer structure.

19. The vertical memory device of claim 18, further comprising:
- a channel connection pattern on the second substrate, the channel connection pattern connecting the channels with each other; and
- a support layer between the channel connection pattern and the gate electrodes.

* * * * *